(12) United States Patent
Chang et al.

(10) Patent No.: US 10,446,529 B2
(45) Date of Patent: Oct. 15, 2019

(54) DISPLAY DEVICE USING SEMICONDUCTOR LIGHT EMITTING DEVICE

(71) Applicant: LG ELECTRONICS INC., Seoul (KR)

(72) Inventors: Younghak Chang, Seoul (KR); Minwoo Lee, Seoul (KR); Yeonhong Jung, Seoul (KR); Youngje Jo, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 15/874,720

(22) Filed: Jan. 18, 2018

(65) Prior Publication Data

US 2019/0081025 A1 Mar. 14, 2019

(30) Foreign Application Priority Data

Sep. 12, 2017 (KR) .................. 10-2017-0116760

(51) Int. Cl.
| | |
|---|---|
| *H01L 25/07* | (2006.01) |
| *H01L 25/075* | (2006.01) |
| *H01L 33/02* | (2010.01) |
| *H01L 33/00* | (2010.01) |
| *H01L 33/20* | (2010.01) |
| *H01L 33/62* | (2010.01) |
| *H01L 33/16* | (2010.01) |

(Continued)

(52) U.S. Cl.
CPC ........ *H01L 25/0753* (2013.01); *H01L 33/007* (2013.01); *H01L 33/0079* (2013.01); *H01L 33/025* (2013.01); *H01L 33/16* (2013.01); *H01L 33/20* (2013.01); *H01L 33/22* (2013.01); *H01L 33/62* (2013.01); *H01L 33/325* (2013.01); *H01L 2933/0025* (2013.01)

(58) Field of Classification Search
CPC ...................................................... H01L 33/025
See application file for complete search history.

(56) References Cited

U.S. PATENT DOCUMENTS

| 9,741,912 B2* | 8/2017 | Hoeppel | ............... H01L 33/405 |
|---|---|---|---|
| 2012/0056229 A1* | 3/2012 | Hsu | ....................... H01L 33/486 |
| | | | 257/98 |

\* cited by examiner

*Primary Examiner* — Caridad Everhart
*Assistant Examiner* — Ankush K Singal
(74) *Attorney, Agent, or Firm* — Birch, Stewart, Kolasch & Birch, LLP

(57) ABSTRACT

A semiconductor light emitting device including a first conductive electrode and a second conductive electrode; a first conductive semiconductor layer on which the first conductive electrode is disposed; a second conductive semiconductor layer overlapping the first conductive semiconductor layer, on which the second conductive electrode is disposed; and an active layer disposed between the first conductive semiconductor layer and the second conductive semiconductor layer. Further, the second conductive semiconductor layer includes a first layer including a porous material capable of being electro-polished and disposed on an outer surface of the semiconductor light emitting device; a second layer disposed under the first layer and having a lower impurity concentration than the first layer; and a third layer disposed between the second layer and the active layer and having a higher impurity concentration than the second layer.

16 Claims, 21 Drawing Sheets

(51) Int. Cl.
*H01L 33/22* (2010.01)
*H01L 33/32* (2010.01)

DISPLAY DEVICE USING SEMICONDUCTOR LIGHT EMITTING DEVICE

CROSS-REFERENCE TO RELATED APPLICATIONS

This application claims the benefit of priority of Korean Patent Application No. 10-2017-0116760, filed on Sep. 12, 2017, which is herein expressly incorporated by reference in its entirety.

BACKGROUND OF THE INVENTION

1. Field of the Invention

The present disclosure relates to a display device, and more particularly, to a display device using a semiconductor light emitting device.

2. Description of the Related Art

In recent years, display devices having excellent characteristics such as low profile, flexibility and the like have been developed in the display technical field. Currently commercialized main displays are represented by liquid crystal displays (LCDs) and active matrix organic light emitting diodes (AMOLEDs).

However, there exist problems such as a slow response time, difficult implementation of flexibility for LCDs, and there exist drawbacks such as short life span, poor yield as well as low flexibility for AMOLEDs. Further, light emitting diodes (LEDs) are well known light emitting devices for converting an electrical current to light, and have been used as a light source for displaying an image in an electronic device including information communication devices since red LEDs using GaAsP compound semiconductors were made commercially available in 1962, together with a GaP: N-based green LEDs. Accordingly, the semiconductor light emitting devices can be used to implement a flexible display, thereby presenting a scheme for solving the problems.

In a display using the semiconductor light emitting devices, the semiconductor light emitting devices grown on a growth substrate can be transferred onto a wiring substrate. Here, the semiconductor light emitting devices can be separated from the growth substrate using a laser lift-off method (LLO) or a chemical lift-off method (CLO). However, when the semiconductor light emitting devices are transferred, damage to the semiconductor light emitting devices due to heat or chemicals may occur. In addition, there is a disadvantage in that process cost is increased due to high facility cost, thereby increasing fabrication cost.

SUMMARY OF THE INVENTION

An object of the present disclosure is to provide a display device capable of preventing a semiconductor light emitting device from being damaged due to heat or chemicals, and reducing fabrication cost during a process of separating the semiconductor light emitting device from a growth substrate.

Another object of the present disclosure is to provide a display device having a semiconductor light emitting device with enhanced luminous efficiency.

According to a display device associated with the present disclosure, when a semiconductor light emitting device may be separated by a mechanical lift-off method when the semiconductor light emitting device is separated from a growth substrate, thereby preventing the semiconductor light emitting device from being damaged due to heat or chemicals. In addition, a layer formed of a porous material can be disposed in the semiconductor light emitting device, and formed to minimize light emitted to a lateral surface of the semiconductor light emitting device, and emit light to a surface of the semiconductor light emitting device, thereby enhancing a luminous efficiency of the semiconductor light emitting device.

Furthermore, the present disclosure discloses a semiconductor light emitting device, including a first conductive electrode and a second conductive electrode, a first conductive semiconductor layer on which the first conductive electrode is disposed, a second conductive semiconductor layer configured to overlap with the first conductive semiconductor layer, on which the second conductive electrode is disposed, and an active layer disposed between the first conductive semiconductor layer and the second conductive semiconductor layer.

Furthermore, the present disclosure discloses a method of fabricating a display device, and the method may include growing a first conductive semiconductor layer, an active layer, a second conductive semiconductor layer, and an undoped semiconductor layer on a growth substrate, isolating semiconductor light emitting devices on the growth substrate through etching, forming a first conductive electrode and a second conductive electrode corresponding to the first conductive semiconductor layer and the second conductive semiconductor layer, respectively, an electro-polishing process of etching part of the second conductive semiconductor layer to form pores, electrically connecting the first conductive electrode to a wiring substrate, and a mechanical lift-off process of separating the growth substrate from the wiring substrate.

In a display device according to the present disclosure, a layer of a porous material capable of being electro-polished can be disposed and separated by a mechanical lift-off method when the semiconductor light emitting device is separated from the growth substrate, thereby prevent the semiconductor light emitting device from being damaged due to heat or chemicals. Furthermore, process cost may be reduced, thereby providing a display device with reduced fabrication cost.

In addition, according to the present disclosure, a layer of a porous material can be disposed in the semiconductor light emitting device, thereby diffracting light generated within the semiconductor light emitting device without loss in the layer of the porous material. As a result, it is possible to minimize light emitted to a lateral surface of the semiconductor light emitting device, and emit light to a surface of the semiconductor light emitting device, thereby enhancing a luminous efficiency of the semiconductor light emitting device.

Further scope of applicability of the present invention will become apparent from the detailed description given hereinafter. However, the detailed description and specific examples, while indicating preferred embodiments of the invention, are given by illustration only, since various changes and modifications within the spirit and scope of the invention will become apparent to those skilled in the art from this detailed description.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE INVENTION

Figure 1:
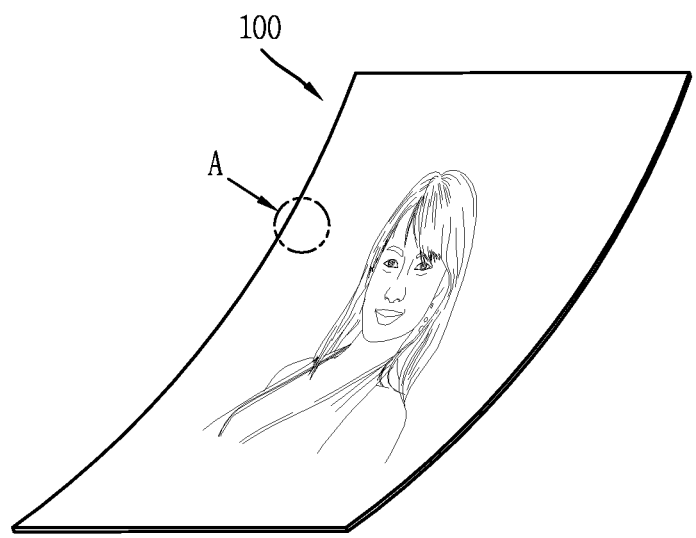
FIG. 1 is a conceptual view illustrating a display device using a semiconductor light emitting device according to an embodiment of the present disclosure.

Hereinafter, the embodiments disclosed herein will be described in detail with reference to the accompanying drawings, and the same or similar elements are designated with the same numeral references regardless of the numerals in the drawings and their redundant description will be omitted. A suffix "module" and "unit" used for constituent elements disclosed in the following description is merely intended for easy description of the specification, and the suffix itself does not give any special meaning or function. Also, it should be noted that the accompanying drawings are merely illustrated to easily explain the concept of the invention, and therefore, they should not be construed to limit the technological concept disclosed herein by the accompanying drawings. When an element such as a layer, region or substrate is referred to as being "on" another element, it can be directly on the another element or an intermediate element may also be interposed therebetween.

A display device disclosed herein may include a portable phone, a smart phone, a laptop computer, a digital broadcast terminal, a personal digital assistant (PDA), a portable multimedia player (PMP), a navigation, a slate PC, a tablet PC, an ultrabook, a digital TV, a desktop computer, and the like. However, it would be easily understood by those skilled in the art that a configuration disclosed herein may be applicable to any displayable device even though it is a new product type which will be developed later.

FIG. 1 is a conceptual view illustrating a display device using a semiconductor light emitting device according to an embodiment of the present disclosure. According to the drawing, information processed in the controller of the display device 100 can be displayed using a flexible display.

The flexible display may include a flexible, bendable, twistable, foldable and rollable display. For example, the flexible display may be a display fabricated on a thin and flexible substrate that can be warped, bent, folded or rolled like a paper sheet while maintaining the display characteristics of a flat display in the related art.

A display area of the flexible display becomes a plane in a configuration that the flexible display is not warped (for example, a configuration having an infinite radius of curvature, hereinafter, referred to as a "first configuration"). The display area thereof becomes a curved surface in a configuration that the flexible display is warped by an external force in the first configuration (for example, a configuration having a finite radius of curvature, hereinafter, referred to as a "second configuration"). As illustrated in the drawing, information displayed in the second configuration may be visual information displayed on a curved surface. The visual information can be realized so a light emission of each unit pixel (sub-pixel) arranged in a matrix configuration is controlled independently. The unit pixel denotes an elementary unit for representing one color.

The sub-pixel of the flexible display may be implemented by a semiconductor light emitting device. According to the present disclosure, a light emitting diode (LED) is illustrated as a type of semiconductor light emitting device. The light emitting diode can be formed with a small size to perform the role of a sub-pixel even in the second configuration through this.

Hereinafter, a flexible display implemented using the light emitting diode will be described in more detail with reference to the accompanying drawings. In particular, FIG. 2 is a partial enlarged view of portion "A" in FIG. 1, FIGS. 3A and 3B are cross-sectional views taken along lines B-B and C-C in FIG. 2, FIG. 4 is a conceptual view illustrating a flip-chip type semiconductor light emitting device in FIG. 3A, and FIGS. 5A through 5C are conceptual views illustrating various forms for implementing colors in connection with a flip-chip type semiconductor light emitting device.

Figure 2:
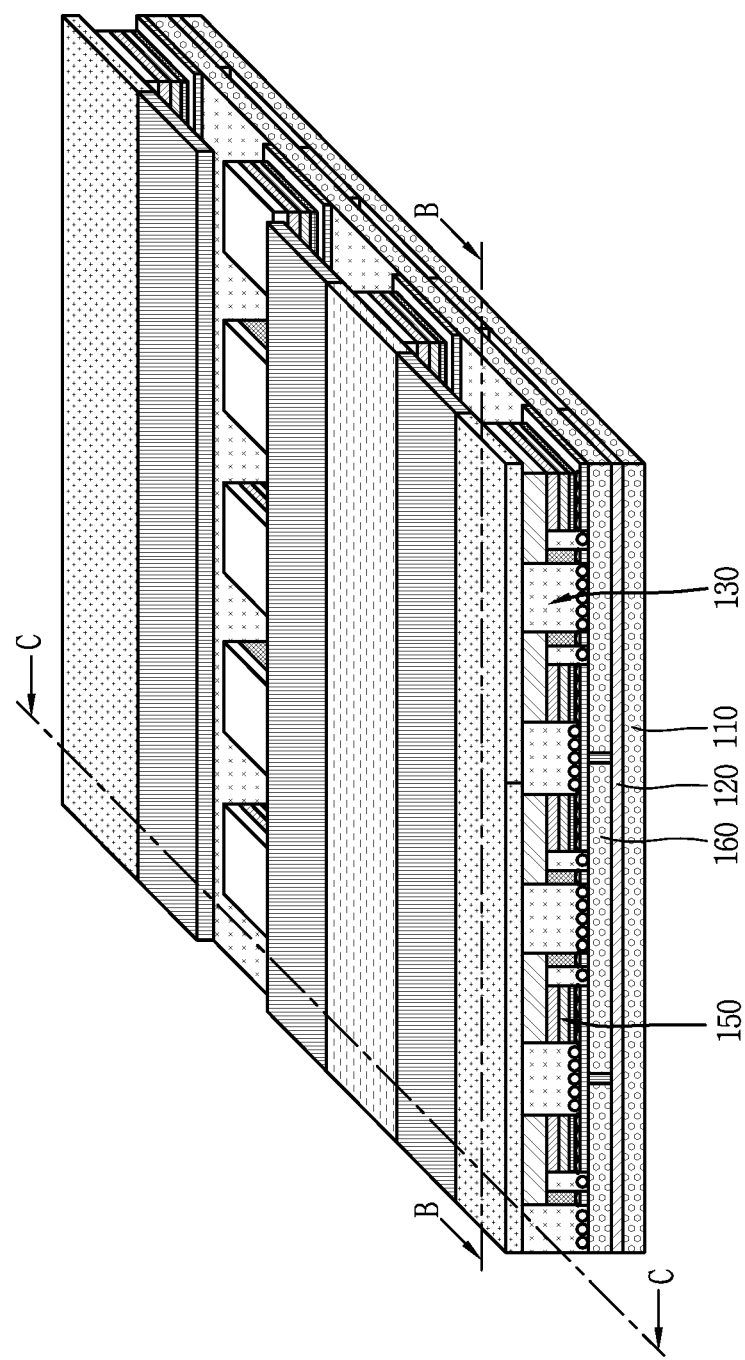
FIG. 2 is a partial enlarged view of portion "A" in FIG. 1, and FIGS. 3A and 3B are cross-sectional views taken along lines B-B and C-C in FIG. 2.
Figure 3A:
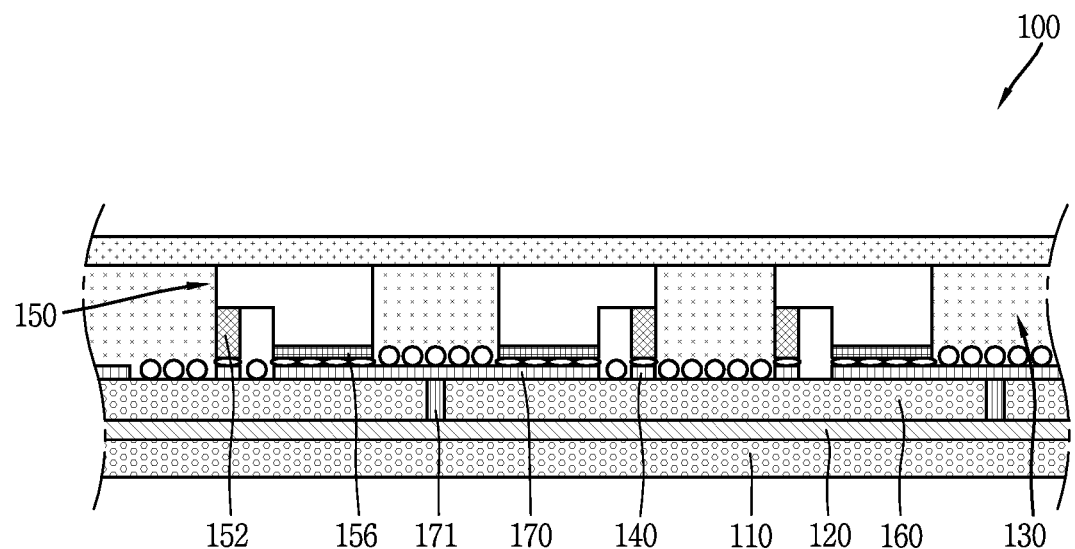
Figure 3B:
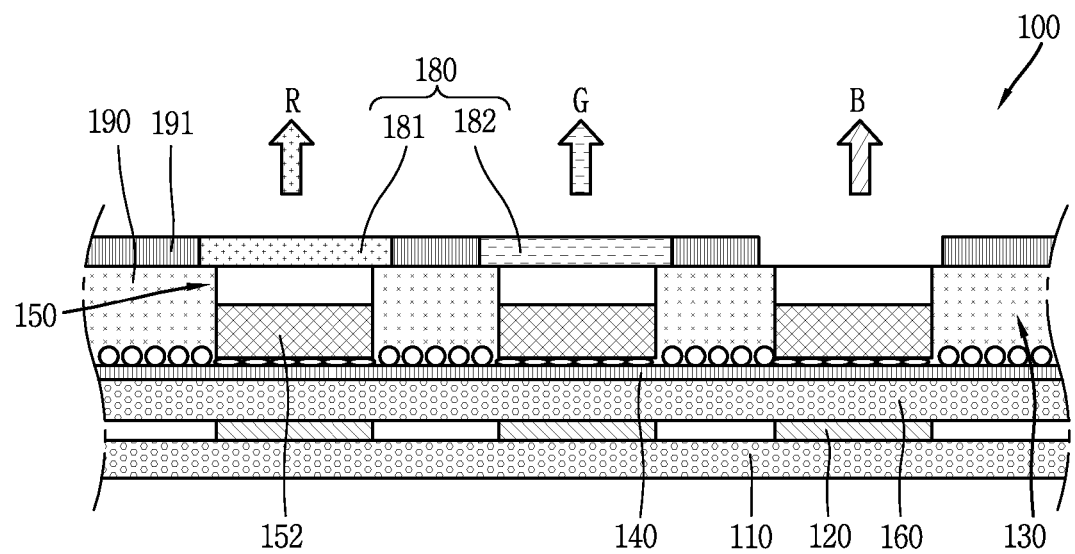
Figure 4:
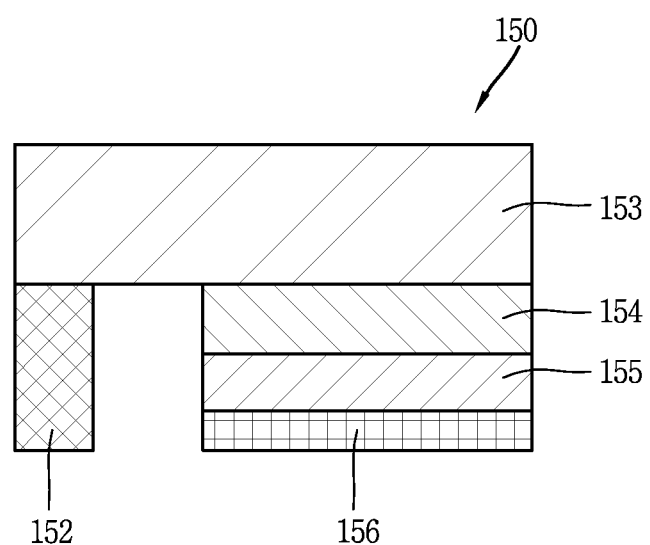
FIG. 4 is a conceptual view illustrating a flip-chip type semiconductor light emitting device in FIG. 3.

FIGS. 2, 3A and 3B illustrate a display device 100 using a passive matrix (PM) type semiconductor light emitting device as a display device 100 using a semiconductor light emitting device. However, an example described below can also be applicable to an active matrix (AM) type semiconductor light emitting device.

The display device 100 can include a substrate 110, a first electrode 120, a conductive adhesive layer 130, a second electrode 140, and a plurality of semiconductor light emitting devices 150. The substrate 110 may be a flexible substrate and contain glass or polyimide (PI) to implement the flexible display device. In addition, if it is a flexible material, any one such as polyethylene naphthalate (PEN), polyethylene terephthalate (PET) or the like may be used. Furthermore, the substrate 110 may be either one of transparent and non-transparent materials.

The substrate 110 can be a wiring substrate disposed with the first electrode 120, and thus the first electrode 120 can be placed on the substrate 110.

According to the drawing, an insulating layer 160 can be disposed on the substrate 110 placed with the first electrode 120, and an auxiliary electrode 170 can be placed on the insulating layer 160. In this instance, a configuration in which the insulating layer 160 is deposited on the substrate 110 can be a single wiring substrate. More specifically, the insulating layer 160 can be incorporated into the substrate 110 with an insulating and flexible material such as polyimide (PI), PET, PEN or the like to form single wiring substrate.

The auxiliary electrode 170 as an electrode for electrically connecting the first electrode 120 to the semiconductor light emitting device 150 is placed on the insulating layer 160, and disposed to correspond to the location of the first electrode 120. For example, the auxiliary electrode 170 has a dot shape, and can be electrically connected to the first electrode 120 by an electrode hole 171 passing through the insulating layer 160. The electrode hole 171 can be formed by filling a conductive material in a via hole.

Referring to the drawings, the conductive adhesive layer 130 can be formed on one surface of the insulating layer 160, but the present disclosure is not limited to this. For example, it is possible to also have a structure in which the conductive adhesive layer 130 is disposed on the substrate 110 with no insulating layer 160. The conductive adhesive layer 130 can perform the role of an insulating layer in the structure in which the conductive adhesive layer 130 is disposed on the substrate 110.

The conductive adhesive layer 130 can be a layer having adhesiveness and conductivity, and thus a conductive material and an adhesive material can be mixed on the conductive adhesive layer 130. Furthermore, the conductive adhesive layer 130 can have flexibility, thereby allowing a flexible function in the display device.

For example, the conductive adhesive layer 130 may be an anisotropic conductive film (ACF), an anisotropic conductive paste, a solution containing conductive particles, and the like. The conductive adhesive layer 130 allows electrical interconnection in the z-direction passing through the thickness thereof, but can be configured as a layer having electrical insulation in the horizontal x-y direction thereof. Accordingly, the conductive adhesive layer 130 can be referred to as a z-axis conductive layer (however, hereinafter referred to as a "conductive adhesive layer").

The anisotropic conductive film includes an anisotropic conductive medium mixed with an insulating base member, and thus when heat and pressure are applied thereto, only a specific portion thereof has conductivity by the anisotropic conductive medium. Hereinafter, heat and pressure are applied to the anisotropic conductive film, but other methods are also available for the anisotropic conductive film to partially have conductivity. The methods include applying only either one of heat and pressure thereto, UV curing, and the like.

Furthermore, the anisotropic conductive medium may be conductive balls or particles. According to the drawing, in this example, the anisotropic conductive film includes an anisotropic conductive medium mixed with an insulating base member, and thus when heat and pressure are applied thereto, only a specific portion thereof has conductivity by the conductive balls. The anisotropic conductive film may include a core with a conductive material containing a plurality of particles coated by an insulating layer with a polymer material, and in this instance, it can have conductivity by the core while breaking an insulating layer on a portion to which heat and pressure are applied.

Here, a core can be transformed to implement a layer having both surfaces to which objects contact in the thickness direction of the film. For a more specific example, heat and pressure are applied to an anisotropic conductive film as a whole, and electrical connection in the z-axis direction is partially formed by a height difference from a mating object adhered by the use of the anisotropic conductive film.

In another example, an anisotropic conductive film includes a plurality of particles in which a conductive material is coated on insulating cores. In this instance, a portion to which heat and pressure are applied can be converted (pressed and adhered) to a conductive material to have conductivity in the thickness direction of the film. For still another example, the film can be formed to have conductivity in the thickness direction of the film in which a conductive material passes through an insulating base member in the z-direction. In this instance, the conductive material may have a pointed end portion.

According to the drawing, the anisotropic conductive film can be a fixed array anisotropic conductive film (ACF) including conductive balls inserted into one surface of the insulating base member. More specifically, the insulating base member is formed of an adhesive material, and the conductive balls are intensively disposed at a bottom portion of the insulating base member, and when heat and pressure are applied thereto, the base member is modified along with the conductive balls, thereby having conductivity in the vertical direction thereof.

However, the present disclosure is not limited to this, and the anisotropic conductive film can include conductive balls randomly mixed with an insulating base member or a form configured with a plurality of layers in which conductive balls are disposed at any one layer (double-ACF), and the like.

The anisotropic conductive paste as a form coupled to a paste and conductive balls may be a paste in which conductive balls are mixed with an insulating and adhesive base material. Furthermore, a solution containing conductive particles can be a solution in a form containing conductive particles or nano particles.

Referring again to the drawing, the second electrode 140 is located at the insulating layer 160 to be separated from the auxiliary electrode 170. In other words, the conductive adhesive layer 130 is disposed on the insulating layer 160 located with the auxiliary electrode 170 and second electrode 140.

When the conductive adhesive layer 130 is formed when the auxiliary electrode 170 and second electrode 140 are located, and then the semiconductor light emitting device 150 is connect thereto in a flip chip form with the application of heat and pressure, the semiconductor light emitting device 150 is electrically connected to the first electrode 120 and second electrode 140.

Referring to FIG. 4, the semiconductor light emitting device may be a flip chip type semiconductor light emitting device. For example, the semiconductor light emitting device may include a p-type electrode 156, a p-type semiconductor layer 155 formed with the p-type electrode 156, an active layer 154 formed on the p-type semiconductor layer 155, an n-type semiconductor layer 153 formed on the active layer 154, and an n-type electrode 152 disposed to be separated from the p-type electrode 156 in the horizontal direction on the n-type semiconductor layer 153. In this instance, the p-type electrode 156 may be electrically connected to the welding portion 179 by the conductive adhesive layer 130, and the n-type electrode 152 may be electrically connected to the second electrode 140.

Referring to FIGS. 2, 3A and 3B again, the auxiliary electrode 170 can be formed in an elongated manner in one direction to be electrically connected to a plurality of semiconductor light emitting devices 150. For example, the left and right p-type electrodes of the semiconductor light emitting devices around the auxiliary electrode can be electrically connected to one auxiliary electrode.

More specifically, the semiconductor light emitting device 150 is pressed into the conductive adhesive layer 130, and through this, only a portion between the p-type electrode 156 and auxiliary electrode 170 of the semiconductor light emitting device 150 and a portion between the n-type electrode 152 and second electrode 140 of the semiconductor light emitting device 150 have conductivity, and the remaining portion does not have conductivity since there is no push-down of the semiconductor light emitting device. As described above, the conductive adhesive layer 130 can form an electrical connection as well as allow a mutual coupling between the semiconductor light emitting device 150 and the auxiliary electrode 170 and between the semiconductor light emitting device 150 and the second electrode 140.

Furthermore, a plurality of semiconductor light emitting devices 150 constitute a light-emitting array, and a phosphor layer 180 is formed on the light-emitting array. The light emitting device array can also include a plurality of semiconductor light emitting devices with different self luminance values. Each of the semiconductor light emitting devices 150 constitutes a sub-pixel, and is electrically connected to the first electrode 120. For example, there may exist a plurality of first electrodes 120, and the semiconductor light emitting devices are arranged in several rows, for instance, and each row of the semiconductor light emitting devices may be electrically connected to any one of the plurality of first electrodes.

Furthermore, the semiconductor light emitting devices can be connected in a flip chip form, and thus semiconductor light emitting devices grown on a transparent dielectric substrate. In addition, the semiconductor light emitting devices may be nitride semiconductor light emitting devices, for instance. The semiconductor light emitting device 150 has an excellent luminance characteristic, and thus it is possible to configure individual sub-pixels even with a small size thereof.

According to the drawing, a partition wall 190 can be formed between the semiconductor light emitting devices 150. In this instance, the partition wall 190 can perform the role of dividing individual sub-pixels from one another, and be formed as an integral body with the conductive adhesive layer 130. For example, a base member of the anisotropic conductive film can form the partition wall when the semiconductor light emitting device 150 is inserted into the anisotropic conductive film.

When the base member of the anisotropic conductive film is black, the partition wall 190 can have reflective characteristics while at the same time increasing contrast with no additional black insulator. In another example, a reflective partition wall can be separately provided with the partition wall 190. In this instance, the partition wall 190 may include a black or white insulator according to the purpose of the display device. The partition wall has an effect of enhancing reflectivity when the partition wall of the white insulator is used, and increase contrast while at the same time having reflective characteristics.

Further, the phosphor layer 180 is located at an outer surface of the semiconductor light emitting device 150. For example, the semiconductor light emitting device 150 is a blue semiconductor light emitting device that emits blue (B) light, and the phosphor layer 180 performs the role of converting the blue (B) light into the color of a sub-pixel. The phosphor layer 180 can also be a red phosphor layer 181 or green phosphor layer 182 constituting individual pixels.

In other words, a red phosphor 181 capable of converting blue light into red (R) light can be deposited on the blue semiconductor light emitting device 151 at a location implementing a red sub-pixel, and a green phosphor 182 capable of converting blue light into green (G) light can be deposited on the blue semiconductor light emitting device 151 at a location implementing a green sub-pixel. Also, only the blue semiconductor light emitting device 151 can be solely used at a location implementing a blue sub-pixel. In this instance, the red (R), green (G) and blue (B) sub-pixels may implement one pixel. More specifically, one color phosphor can be deposited along each line of the first electrode 120. Accordingly, one line on the first electrode 120 may be an electrode controlling one color. In other words, red (R), green (B) and blue (B) can be sequentially disposed along the second electrode 140, thereby implementing sub-pixels.

However, the present disclosure is not limited to this, and the semiconductor light emitting device 150 can be combined with a quantum dot (QD) instead of a phosphor to implement sub-pixels such as red (R), green (G) and blue (B). Furthermore, a black matrix 191 can be disposed between each phosphor layer to enhance contrast. In other words, the black matrix 191 can enhance the contrast of luminance. However, the present disclosure is not limited to this, and another structure for implementing blue, red and green may be also applicable thereto.

Figure 5A:
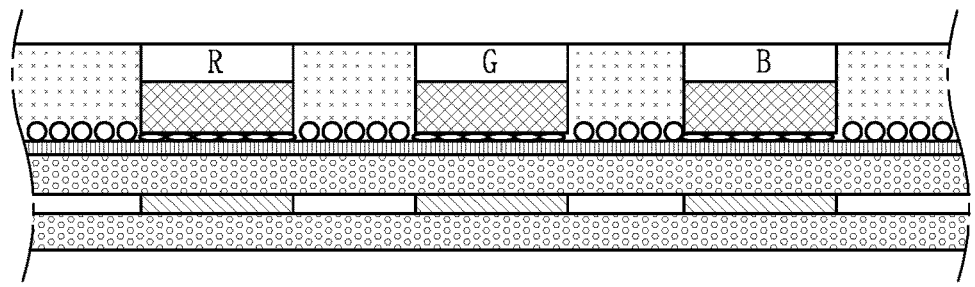
FIGS. 5A through 5C are conceptual views illustrating various forms for implementing colors in connection with a flip-chip type semiconductor light emitting device.

Referring to FIG. 5A, each of the semiconductor light emitting devices 150 may be implemented with a high-power light emitting device that emits various lights including blue in which gallium nitride (GaN) is mostly used, and indium (In) and or aluminum (Al) are added thereto. In this instance, the semiconductor light emitting device 150 may be red, green and blue semiconductor light emitting devices, respectively, to implement each sub-pixel. For instance, red, green and blue semiconductor light emitting devices (R, G, B) are alternately disposed, and red, green and blue sub-pixels implement one pixel by the red, green and blue semiconductor light emitting devices, thereby implementing a full color display.

Figure 5B:
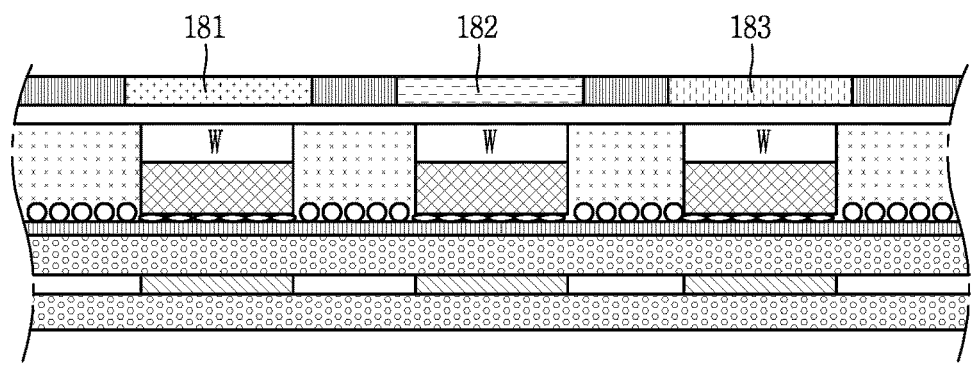

Referring to FIG. 5B, the semiconductor light emitting device may have a white light emitting device (W) provided with a yellow phosphor layer for each element. In this instance, a red phosphor layer 181, a green phosphor layer 182 and a blue phosphor layer 183 may be provided on the white light emitting device (W) to implement a sub-pixel. Furthermore, a color filter repeated with red, green and blue on the white light emitting device (W) may be used to implement a sub-pixel.

Figure 5C:
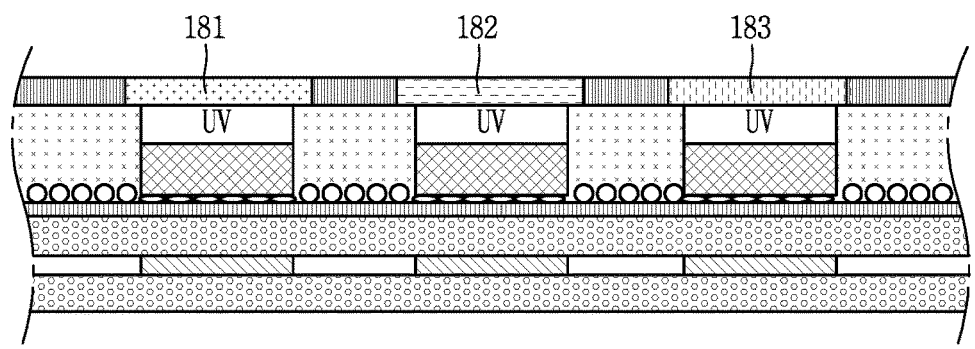

Referring to FIG. 5C, it is possible to also have a structure in which a red phosphor layer 181, a green phosphor layer 182 and blue phosphor layer 183 are provided on a ultra violet light emitting device (UV). Thus, the semiconductor light emitting device can be used over the entire region up to ultra violet (UV) as well as visible light, and may be extended to a form of semiconductor light emitting device in which ultra violet (UV) can be used as an excitation source.

Taking the present example into consideration again, the semiconductor light emitting device 150 is placed on the conductive adhesive layer 130 to configure a sub-pixel in the display device. The semiconductor light emitting device 150 has an excellent luminance characteristic, and thus it is possible to configure individual sub-pixels even with a small size thereof. The size of the individual semiconductor light emitting device 150 can be less than 80 µm in the length of one side thereof, and formed with a rectangular or square shaped element. For a rectangular shaped element, the size thereof can be less than 20×80 µm.

In addition, even when a square shaped semiconductor light emitting device 150 with a length of side of 10 µm is used for a sub-pixel, it will exhibit a sufficient brightness for implementing a display device. Accordingly, for example, for a rectangular pixel in which one side of a sub-pixel is 600 µm in size, and the remaining one side thereof is 300 µm, a relative distance between the semiconductor light emitting devices becomes sufficiently large. Accordingly, in this instance, it is possible to implement a flexible display device having an HD image quality.

Figure 6:
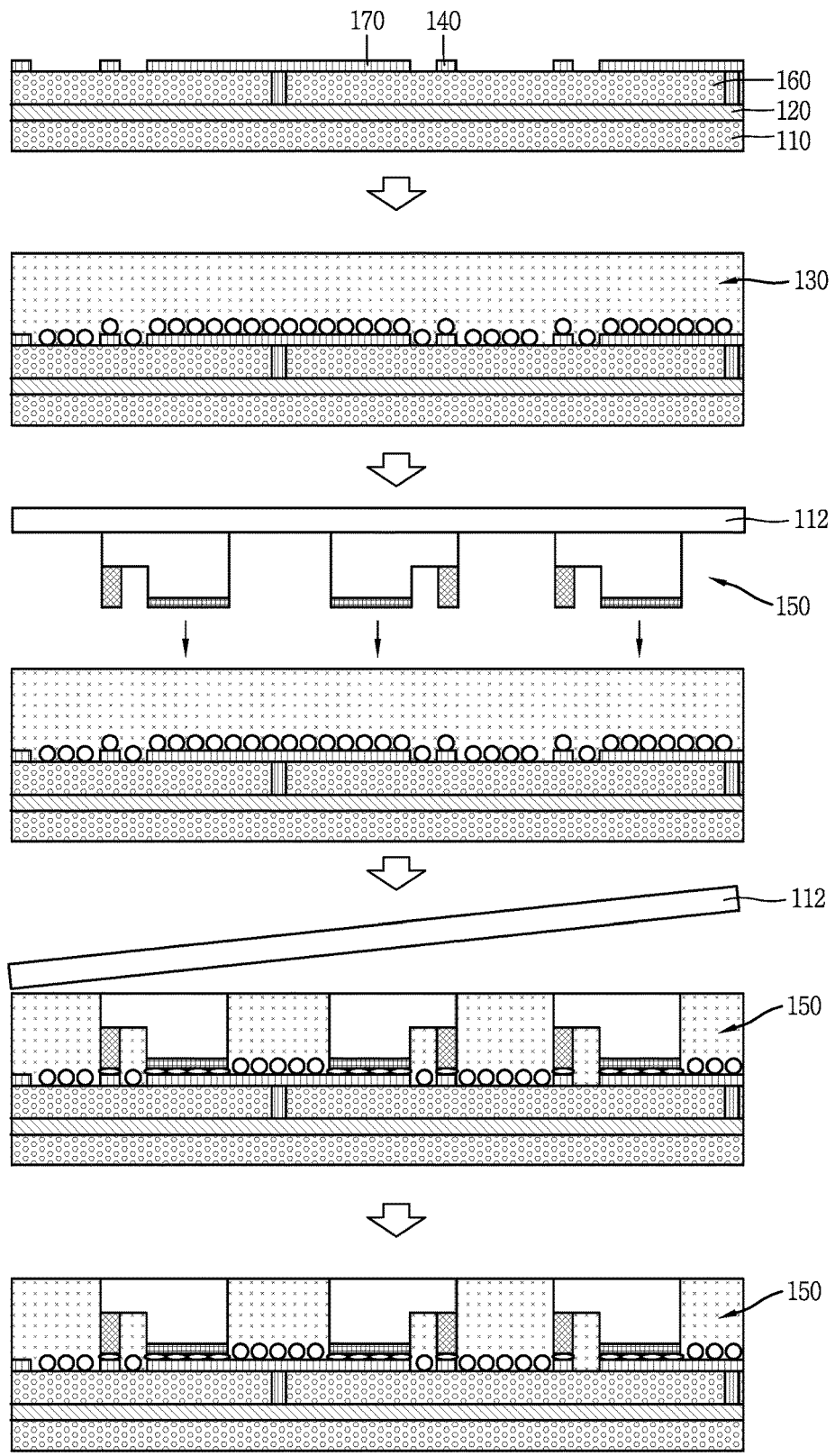
FIG. 6 is cross-sectional views illustrating a fabrication method of a display device using a semiconductor light emitting device according to the present disclosure.

A display device using the foregoing semiconductor light emitting device will be fabricated by a novel type of fabrication method. Hereinafter, the fabrication method will be described with reference to FIG. 6. In particular, FIG. 6 is cross-sectional views illustrating a fabrication method of a display device using a semiconductor light emitting device according to the present disclosure.

Referring to the drawing, first, the conductive adhesive layer 130 is formed on the insulating layer 160 located with the auxiliary electrode 170 and second electrode 140. The insulating layer 160 is deposited on the first substrate 110 to form one substrate (or wiring substrate), and the first electrode 120, auxiliary electrode 170 and second electrode 140 are disposed at the wiring substrate. In this instance, the first electrode 120 and second electrode 140 can be disposed in a perpendicular direction to each other. Furthermore, the first substrate 110 and insulating layer 160 may contain glass or polyimide (PI), respectively, to implement a flexible display device.

The conductive adhesive layer 130 may be implemented by an anisotropic conductive film, for example, and thus an anisotropic conductive film may be coated on a substrate located with the insulating layer 160. Next, a second substrate 112 located with a plurality of semiconductor light emitting devices 150 corresponding to the location of the auxiliary electrodes 170 and second electrodes 140 and constituting individual pixels is disposed such that the semiconductor light emitting device 150 faces the auxiliary electrode 170 and second electrode 140.

In this instance, the second substrate 112 as a growth substrate for growing the semiconductor light emitting device 150 may be a sapphire substrate or silicon substrate. The semiconductor light emitting device may have a gap and size capable of implementing a display device when formed in the unit of wafer, and thus effectively used for a display device.

Next, the wiring substrate is thermally compressed to the second substrate 112. For example, the wiring substrate and second substrate 112 can be thermally compressed to each other by applying an ACF press head. The wiring substrate and second substrate 112 are bonded to each other using the thermal compression. Only a portion between the semiconductor light emitting device 150 and the auxiliary electrode 170 and second electrode 140 has conductivity due to the characteristics of an anisotropic conductive film having conductivity by thermal compression, thereby allowing the electrodes and semiconductor light emitting device 150 to be electrically connected to each other. At this time, the semiconductor light emitting device 150 can be inserted into the anisotropic conductive film, thereby forming a partition wall between the semiconductor light emitting devices 150.

Next, the second substrate 112 is removed. For example, the second substrate 112 may be removed using a laser lift-off (LLO) or chemical lift-off (CLO) method. Finally, the second substrate 112 is removed to expose the semiconductor light emitting devices 150 to the outside. Silicon oxide (SiOx) or the like may be coated on the wiring substrate coupled to the semiconductor light emitting device 150 to form a transparent insulating layer.

The process of forming a phosphor layer on one surface of the semiconductor light emitting device 150 may also be included. For example, the semiconductor light emitting device 150 can be a blue semiconductor light emitting device for emitting blue (B) light, and red or green phosphor for converting the blue (B) light into the color of the sub-pixel can form a layer on one surface of the blue semiconductor light emitting device.

The fabrication method or structure of a display device using the foregoing semiconductor light emitting device can be modified in various forms. For example, the foregoing display device may be applicable to a vertical semiconductor light emitting device. Hereinafter, the vertical structure will be described with reference to FIGS. 5 and 6.

Furthermore, according to the following modified example or embodiment, the same or similar reference numerals are designated to the same or similar configurations to the foregoing example, and the description thereof will be substituted by the earlier description.

Figure 7:
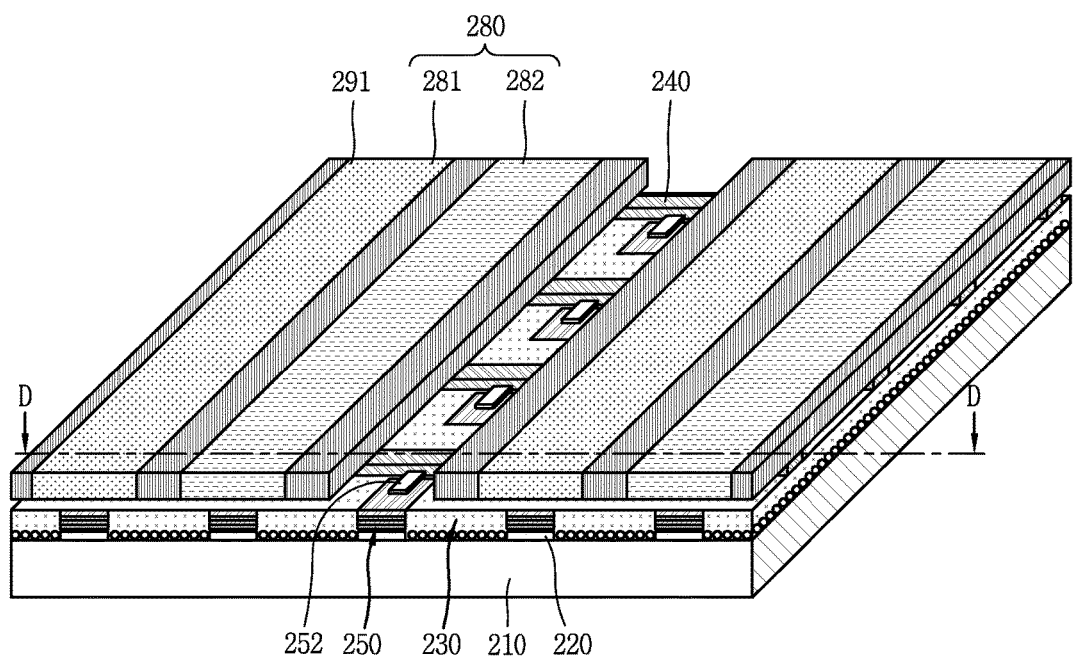
FIG. 7 is a perspective view illustrating a display device using a semiconductor light emitting device according to another embodiment of the present disclosure.
Figure 8:
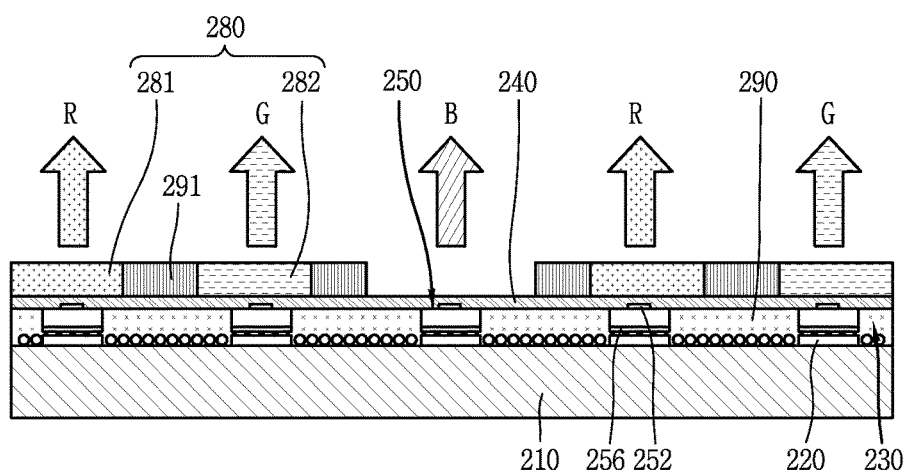
FIG. 8 is a cross-sectional view taken along line C-C in FIG. 7.
Figure 9:
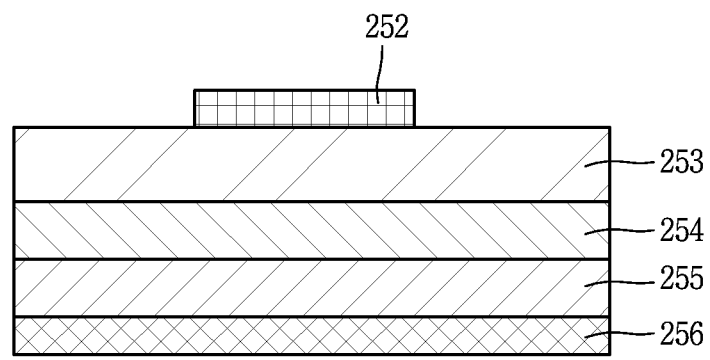
FIG. 9 is a conceptual view illustrating a vertical type semiconductor light emitting device in FIG. 8.

Next, FIG. 7 is a perspective view illustrating a display device using a semiconductor light emitting device according to another embodiment of the present disclosure, FIG. 8 is a cross-sectional view taken along line C-C in FIG. 7, and FIG. 9 is a conceptual view illustrating a vertical type semiconductor light emitting device in FIG. 8. According to the drawings, the display device can use a passive matrix (PM) type of vertical semiconductor light emitting device.

As shown, the display device includes a substrate 210, a first electrode 220, a conductive adhesive layer 230, a second electrode 240 and a plurality of semiconductor light emitting devices 250. The substrate 210 as a wiring substrate disposed with the first electrode 220 may include polyimide (PI) to implement a flexible display device. In addition, any one may be used if it is an insulating and flexible material.

The first electrode 220 is located on the substrate 210, and formed with a bar-shaped electrode elongated in one direction. The first electrode 220 can be formed to perform the role of a data electrode. The conductive adhesive layer 230 is formed on the substrate 210 located with the first electrode 220. Similarly to a display device to which a flip chip type light emitting device is applied, the conductive adhesive layer 230 may be an anisotropic conductive film (ACF), an anisotropic conductive paste, a solution containing conductive particles, and the like. However, the present embodiment illustrates the conductive adhesive layer 230 is implemented by an anisotropic conductive film.

When an anisotropic conductive film is located when the first electrode 220 is located on the substrate 210, and then heat and pressure are applied to connect the semiconductor light emitting device 250 thereto, the semiconductor light emitting device 250 is electrically connected to the first electrode 220. At this time, the semiconductor light emitting device 250 may be preferably disposed on the first electrode 220.

The electrical connection is generated because an anisotropic conductive film partially has conductivity in the thickness direction when heat and pressure are applied as described above. Accordingly, the anisotropic conductive film is partitioned into a portion 231 having conductivity and a portion 232 having no conductivity in the thickness direction thereof.

In addition, the anisotropic conductive film contains an adhesive component, and thus the conductive adhesive layer 230 implements a mechanical coupling as well as an electrical coupling between the semiconductor light emitting device 250 and the first electrode 220. Thus, the semiconductor light emitting device 250 is placed on the conductive adhesive layer 230, thereby configuring a separate sub-pixel in the display device.

Further, the semiconductor light emitting device 250 has an excellent luminance characteristic, and thus it is possible to configure individual sub-pixels even with a small size thereof. The size of the individual semiconductor light emitting device 250 can be less than 80 μm in the length of one side thereof, and formed with a rectangular or square shaped element. For a rectangular shaped element, the size thereof can be less than 20×80 μm. The semiconductor light emitting device 250 can also be a vertical structure.

A plurality of second electrodes 240 disposed in a direction of crossing the length direction of the first electrode 220, and electrically connected to the vertical semiconductor light emitting device 250 is located between vertical semiconductor light emitting devices.

Referring to FIG. 9, the vertical semiconductor light emitting device may include a p-type electrode 256, a p-type semiconductor layer 255 formed with the p-type electrode 256, an active layer 254 formed on the p-type semiconductor layer 255, an n-type semiconductor layer 253 formed on the active layer 254, and an n-type electrode 252 formed on the n-type semiconductor layer 253. In this instance, the p-type electrode 256 located at the bottom thereof may be electrically connected to the first electrode 220 by the conductive adhesive layer 230, and the n-type electrode 252 located at the top thereof may be electrically connected to the second electrode 240 which will be described later. The electrodes can be disposed in the upward/downward direction in the vertical semiconductor light emitting device 250, thereby providing a great advantage capable of reducing the chip size.

Referring again to FIGS. 7 and 8, a phosphor layer 280 can be formed on one surface of the semiconductor light emitting device 250. For example, the semiconductor light emitting device 250 is a blue semiconductor light emitting device 251 that emits blue (B) light, and the phosphor layer 280 for converting the blue (B) light into the color of the sub-pixel can be provided thereon. In this instance, the phosphor layer 280 can be a red phosphor 281 and a green phosphor 282 constituting individual pixels.

In other words, a red phosphor 281 capable of converting blue light into red (R) light can be deposited on the blue semiconductor light emitting device 250 at a location implementing a red sub-pixel, and a green phosphor 282 capable of converting blue light into green (G) light can be deposited on the blue semiconductor light emitting device 250 at a location implementing a green sub-pixel. Also, only the blue semiconductor light emitting device 250 can be solely used at a location implementing a blue sub-pixel. In this instance, the red (R), green (G) and blue (B) sub-pixels may implement one pixel.

However, the present disclosure is not limited to this, and another structure for implementing blue, red and green may be also applicable thereto as described above in a display device to which a flip chip type light emitting device is applied.

Taking the present embodiment into consideration again, the second electrode 240 is located between the semiconductor light emitting devices 250, and electrically connected to the semiconductor light emitting devices 250. For example, the semiconductor light emitting devices 250 can be disposed in a plurality of rows, and the second electrode 240 is located between the rows of the semiconductor light emitting devices 250.

Since a distance between the semiconductor light emitting devices 250 constituting individual pixels is sufficiently large, the second electrode 240 is located between the semiconductor light emitting devices 250. The second electrode 240 can be formed with a bar-shaped electrode elongated in one direction, and disposed in a perpendicular direction to the first electrode.

In addition, the second electrode 240 can be electrically connected to the semiconductor light emitting device 250 by a connecting electrode protruded from the second electrode 240. More specifically, the connecting electrode may be an n-type electrode of the semiconductor light emitting device 250. For example, the n-type electrode is formed with an ohmic electrode for ohmic contact, and the second electrode covers at least part of the ohmic electrode by printing or deposition. Through this, the second electrode 240 can be electrically connected to the n-type electrode of the semiconductor light emitting device 250.

According to the drawing, the second electrode 240 is located on the conductive adhesive layer 230. According to circumstances, a transparent insulating layer containing silicon oxide (SiOx) can be formed on the substrate 210 formed with the semiconductor light emitting device 250. When the transparent insulating layer is formed and then the second electrode 240 is placed thereon, the second electrode 240 is located on the transparent insulating layer. In addition, the second electrode 240 can be formed to be separated from the conductive adhesive layer 230 or transparent insulating layer.

If a transparent electrode such as indium tin oxide (ITO) is used to locate the second electrode 240 on the semiconductor light emitting device 250, the ITO material has a problem of bad adhesiveness with an n-type semiconductor. Accordingly, the second electrode 240 can be placed between the semiconductor light emitting devices 250, thereby obtaining an advantage in which the transparent electrode is not required. Accordingly, an n-type semiconductor layer and a conductive material having a good adhesiveness can be used as a horizontal electrode without being restricted by the selection of a transparent material, thereby enhancing the light extraction efficiency.

According to the drawing, a partition wall 290 can be formed between the semiconductor light emitting devices 250. In other words, the partition wall 290 can be disposed between the vertical semiconductor light emitting devices 250 to isolate the semiconductor light emitting device 250 constituting individual pixels. In this instance, the partition wall 290 can perform the role of dividing individual sub-pixels from one another, and be formed as an integral body with the conductive adhesive layer 230. For example, a base member of the anisotropic conductive film may form the partition wall when the semiconductor light emitting device 250 is inserted into the anisotropic conductive film.

When the base member of the anisotropic conductive film is black, the partition wall 290 can have reflective characteristics while at the same time increasing contrast with no additional black insulator. In another example, a reflective partition wall may be separately provided with the partition wall 290. In this instance, the partition wall 290 may include a black or white insulator according to the purpose of the display device.

If the second electrode 240 is precisely located on the conductive adhesive layer 230 between the semiconductor light emitting devices 250, the partition wall 290 is located between the semiconductor light emitting device 250 and second electrode 240. Accordingly, individual sub-pixels can be configured even with a small size using the semiconductor light emitting device 250, and a distance between the semiconductor light emitting devices 250 may be relatively sufficiently large to place the second electrode 240 between the semiconductor light emitting devices 250, thereby having the effect of implementing a flexible display device having a HD image quality.

According to the drawing, a black matrix 291 can be disposed between each phosphor layer to enhance contrast. In other words, the black matrix 291 can enhance the contrast of luminance. Thus, the semiconductor light emitting device 250 is placed on the conductive adhesive layer 230, thereby configuring a separate sub-pixel in the display device. The semiconductor light emitting device 250 has an excellent luminance characteristic, and thus it is possible to configure individual sub-pixels even with a small size thereof. As a result, it is possible to implement a full color display in which the sub-pixels of red (R), green (G) and blue (B) implement one pixel by the semiconductor light emitting device.

In the display device using the semiconductor light emitting device of the present disclosure described above, a laser lift-off (LLO) method or a chemical lift-off (CLO) method may be used to separate the semiconductor light device. When the semiconductor light emitting device is separated using the laser lift-off method or the chemical lift-off method, damage to the semiconductor light emitting device may be caused by heat or chemicals caused by the laser. In addition, there is a problem in that process cost is increased due to high facility cost, thereby increasing fabrication cost. Accordingly, in the present disclosure, a display device having a novel structure capable of solving such a problem will be described.

In other words, according to the present disclosure, when the semiconductor light emitting device is separated from the growth substrate, it is possible to prevent the semiconductor light emitting device from being damaged by heat or chemicals caused by laser, and reducing fabrication cost.

Moreover, a layer of a porous material can be disposed in the semiconductor light emitting device, thereby diffracting light generated within the layer of the porous material without loss in the semiconductor light emitting device. As a result, it is possible to minimize light emitted to a lateral surface of the semiconductor light emitting device, and emit light to a surface of the semiconductor light emitting device, thereby enhancing a luminous efficiency of the semiconductor light emitting device.

Figure 10:
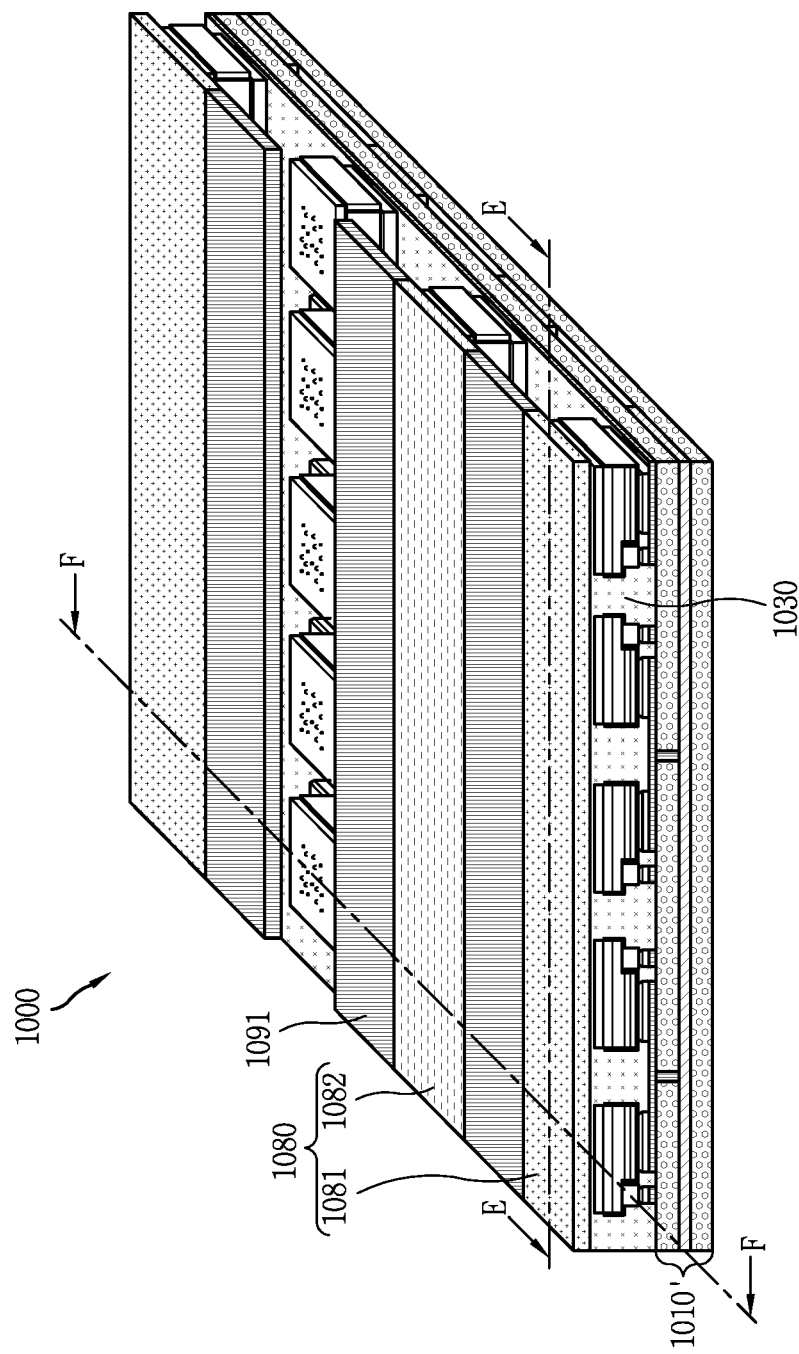
FIG. 10 is an enlarged view of portion "A" in FIG. 1 illustrating another embodiment of the present disclosure to which a semiconductor light emitting device having a new structure is applied.
Figure 11:
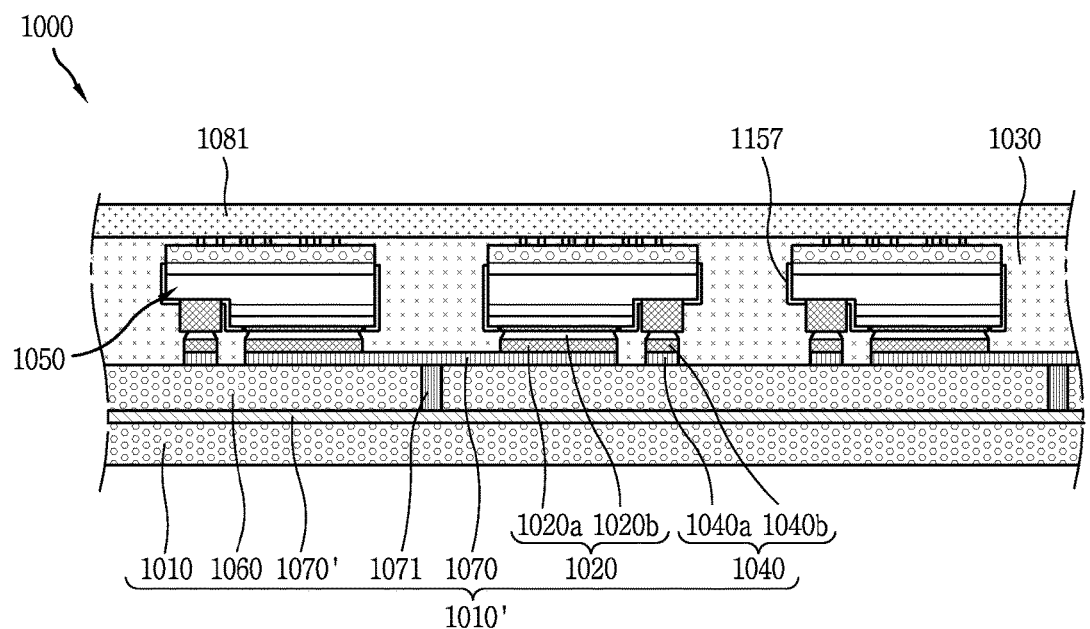
FIG. 11 is a cross-sectional view taken along line E-E in FIG. 10.
Figure 12:
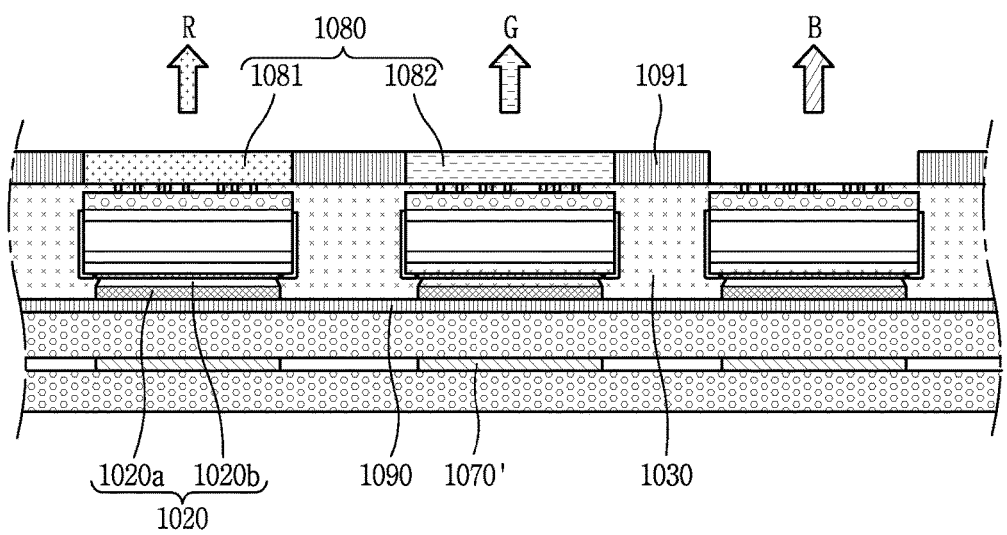
FIG. 12 is a cross-sectional view taken along line F-F in FIG. 10.
Figure 13A:
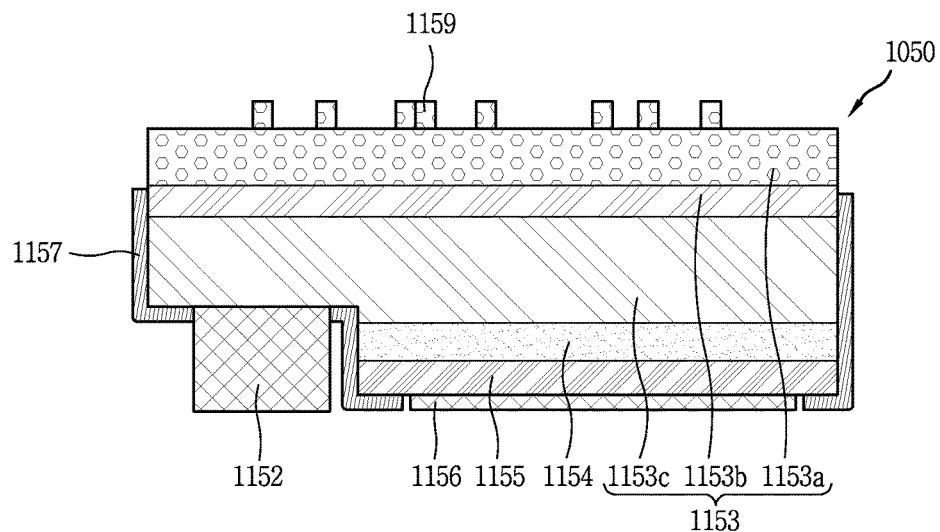
FIG. 13A is a conceptual view illustrating a flip-chip type semiconductor light emitting device in FIG. 11.
Figure 13B:
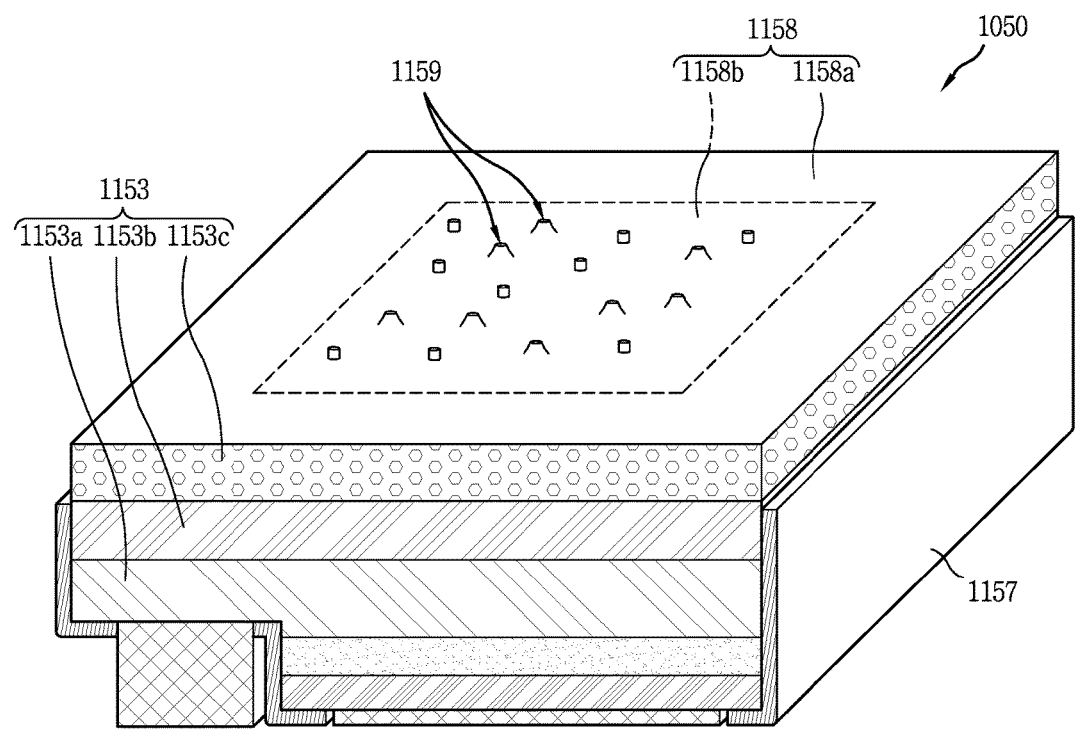
FIG. 13B is a perspective view illustrating a flip-chip type semiconductor light emitting device in FIG. 11.

FIG. 10 is an enlarged view of portion "A" in FIG. 1 illustrating still another embodiment of the present disclosure of a display device having a new structure, FIG. 11 is a cross-sectional view taken along line E-E in FIG. 10, and FIG. 12 is a cross-sectional view taken along line F-F of FIG. 10. Further, FIG. 13A is a conceptual view illustrating a flip-chip type semiconductor light emitting device in FIG. 11, and FIG. 13B is a perspective view illustrating a flip-chip type semiconductor light emitting device in FIG. 11.

According to the drawings in FIGS. 10, 11 and 12, as a display device 1000 using a semiconductor light emitting device, it may be also applicable to the display device 1000 using a passive matrix (PM) type semiconductor light emitting device or an active matrix (AM) type semiconductor light emitting device.

The display device 1000 may include a substrate 1010, a first electrode 1020, an insulating member 1030, a second electrode 1040, and a plurality of semiconductor light emitting devices 1050. Here, the first electrode 1020 and the second electrode 1040 may be protruded from the substrate 1010, and may respectively include a plurality of electrode lines. In addition, the wiring substrate 1010' may include a substrate 1010, an insulating layer 1060, auxiliary electrodes 1070, 1070', an electrode hole 1071, a first electrode 1020, and a second electrode 1040.

The substrate 1010 as a wiring substrate disposed with the first electrode 1020 may include polyimide (PI) to implement a flexible display device. Furthermore, according to circumstances, the substrate 1010 can be formed of an insulating but non-flexible material. Furthermore, the substrate 1010 may be either one of transparent and non-transparent materials.

According to the drawing, an insulating layer 1060 is disposed on the substrate 1010 placed with the first electrode 1020, and an auxiliary electrode 1070 is placed on the insulating layer 1060. In this instance, a configuration in which the insulating layer 1060 is deposited on the substrate 1010 can be a single wiring substrate. Further, the insulating layer 1060 may be incorporated into the substrate 1010 with an insulating material such as polyimide (PI), PET, PEN or the like to form single wiring substrate.

The first electrode 1020 can be protruded on the substrate 1010, and formed with a bar-shaped electrode elongated in one direction. The first electrode 1020 can be formed to perform the role of a data electrode.

Further, the auxiliary electrode 1070 as an electrode for electrically connecting the first electrode 1020 to the semiconductor light emitting device 1050 is placed on the insulating layer 1060, and disposed to correspond to the location of the first electrode 1020. For example, the auxiliary electrode 1070 has a dot shape, and can be electrically connected to the first electrode 1020 by an electrode hole 1071 passing through the insulating layer 1060. The electrode hole 1071 can be formed by filling a conductive material in a via hole.

Referring to the drawings, one side of the insulating layer 1060 can be filled with the insulating member 1030 surrounding the semiconductor light emitting devices 1050. In one embodiment, the insulating member 1030 may include polydimethylsiloxane (PDMS) or polymethylphenylsiloxane (PMPS) as a polymer material, and may include various insulating materials that surround the semiconductor light emitting device 1050. The first conductive electrode 1156 and the second conductive electrode 1152 of the semiconductor light emitting devices 1050 can be electrically coupled to the first electrode 1020 and the second electrode 1040, respectively, in a corresponding manner.

Specifically, the first electrode 1020 may include a protruded metal layer 1020*a* and an adhesive layer 1020*b*. The first conductive electrode 1156 and the metal layer 1020*a* are electrically coupled to each other by applying pressure or heat to the adhesive layer 1020*b*.

Similarly to coupling between the first electrode 1020 and the first conductive electrode 1056, coupling between the second electrode 1040 and the second conductive electrode 1052 can be formed. The second electrode 1040 can also include a protruded metal layer 1040*a* and an adhesive layer 1020*b*. The first conductive electrode 1152 and the metal layer 1040*a* are electrically coupled to each other by applying pressure or heat to the adhesive layer 1040*b*.

Referring to the present drawings, electrical coupling between the semiconductor light emitting device 1050 and the first electrode 1020 and the second electrode 1040 is formed by the adhesive layers 1020*b*, 1040*b* of the first electrode 1020 and the second electrode 1040, but the present disclosure is not limited thereto. For example, the electrodes of the semiconductor light emitting device can be electrically coupled by the above-described conductive adhesive layer or the like. In this instance, the adhesive layers 1020*b*, 1040*b* in this example may be excluded.

Referring again to the drawing, the second electrode 1040 is located at the insulating layer 1060 to be separated from the auxiliary electrode 1070. Specifically, a plurality of second electrodes 1040 disposed in a direction of crossing the length direction of the first electrode 1020, and electrically connected to the semiconductor light emitting device 1050 is located on the insulating layer 1060. In other words, the insulating member 1030 is disposed on the insulating layer 1060 located with the auxiliary electrode 1070 and second electrode 1040.

When the insulating member 1030 is formed in a state where the auxiliary electrode 1070 and second electrode 1040 are located on the insulating layer 1060, and then the semiconductor light emitting device 1050 is connected thereto in a flip chip form with the application of heat and pressure, the semiconductor light emitting device 1050 is electrically connected to the first electrode 1020 and second electrode 1040.

Moreover, the display device 1000 may further include a phosphor layer 1080 formed on one surface of the plurality of semiconductor light emitting devices 1050. For example, the semiconductor light emitting device 1050 is a blue semiconductor light emitting device that emits blue (B) light, and the phosphor layer 1080 performs the role of converting the blue (B) light into the color of a sub-pixel. The phosphor layer 1080 may be a red phosphor layer 1081 or green phosphor layer 1082 constituting individual pixels. In other words, a red phosphor 1081 capable of converting blue light into red (R) light can be deposited on a blue semiconductor light emitting device 1051*a* at a location implementing a red sub-pixel, and a green phosphor 1082 capable of converting blue light into green (G) light can be deposited on the blue semiconductor light emitting device 1051*b* at a location implementing a green sub-pixel. Also, only the blue semiconductor light emitting device 1051*c* may be solely used at a location implementing a blue sub-pixel. In this instance, the red (R), green (G) and blue (B) sub-pixels may implement one pixel.

More specifically, one color phosphor can be deposited along each line of the first electrode 1020. Accordingly, one line on the first electrode 1020 can be an electrode controlling one color. In other words, red (R), green (B) and blue (B) can be sequentially disposed along the second electrode 1040, thereby implementing sub-pixels. However, the present disclosure is not limited to this, and the semiconductor light emitting device 1050 may be combined with a quantum dot (QD) instead of a phosphor to implement sub-pixels that emit red (R), green (G) and blue (B).

Further, the semiconductor light emitting device 1050 may be mostly formed of gallium nitride (GaN) without having a phosphor, and doped with impurities such as indium (In) and aluminum (Al) to control a band gap thereof. Accordingly, a semiconductor light emitting device that emits various light including blue can be implemented through the semiconductor layer with a controlled band gap.

Referring again to the drawing, in order to improve the contrast of the phosphor layer 1080, the display device may further include a black matrix 1091 disposed between each phosphor. The black matrix 1091 can be formed so a gap is formed between the phosphor dots and a black material fills the gap. Through this, the black matrix 1091 can improve contrast between light and dark while absorbing external light reflection.

In addition, the black matrix 1091 is located between respective phosphor layers along the first electrode 1020 in a direction in which the phosphor layers 1080 are layered. In this instance, a phosphor layer may not be formed at a position corresponding to the blue semiconductor light emitting device 1051, but the black matrix 1091 can be respectively formed at both sides thereof by interposing a space that does not have the blue light emitting device 1051*c* therebetween.

As shown in the drawing, the plurality of semiconductor light emitting devices 1050 can form a plurality of columns in a direction parallel to a plurality of electrode lines provided in the first electrode 1020. However, the present disclosure is not limited thereto. For example, the plurality of semiconductor light emitting devices 1050 can form a plurality of columns along the second electrode 1040.

Taking the semiconductor light emitting device 1050 of this example into consideration, a layer formed of a porous material can be disposed in the semiconductor light emitting device 1050, and formed to minimize light emitted to a lateral surface of the semiconductor light emitting device 1050, and emit light to a surface of the semiconductor light emitting device, thereby enhancing a luminous efficiency of the semiconductor light emitting device.

Referring to FIGS. 13A and 13B, the semiconductor light emitting device 1050 of the display device 1000 includes a first conductive electrode 1156 and a second conductive electrode 1152, a first conductive semiconductor layer 1155 disposed with the first conductive electrode 1156, a second conductive semiconductor layer 1153 configured to overlap with the first conductive semiconductor layer 1155, and disposed with the second conductive electrode 1152, and an active layer 1154 disposed between the first conductive semiconductor layer 1155 and the second conductive semiconductor layer 1153.

More specifically, the first conductive electrode 1156 and the first conductive semiconductor layer 1155 may be a p-type electrode and a p-type semiconductor layer, respectively, and the second conductive electrode 1152 and the second conductive semiconductor layer 1153 may be an n-type electrode and an n-type semiconductor layer, respectively. However, the present disclosure is not limited thereto, and the first conductive type may be n-type and the second conductive type may be p-type.

The first conductive electrode 1156 is formed on one surface of the first conductive semiconductor layer 1155, and the active layer 1154 is formed on the other surface of the first conductive semiconductor layer 1155 and one surface of the second conductive semiconductor layer 1153, and the second conductive electrode 1152 is formed on one surface of the second conductive semiconductor layer 1153. In this instance, the second conductive electrode 1152 can be disposed on one surface of the second conductive semiconductor layer 1153 that is not covered by the first conductive semiconductor layer 1155.

The first conductive electrode 1156 and the second conductive electrode 1152 may include at least one of Ti, Cr, Pt, Au, Cu, Sn, Ni, Mo, Ag, Al, and In, and be formed with a multi-layer including an adhesive layer, a barrier layer, a low-resistance layer, an anti-oxidation layer, and the like.

Referring to FIGS. 13A and 13B together with FIGS. 10 through 12, one surface of the second conductive semiconductor layer 1153 disposed with the second conductive electrode 1152 is a lower surface closest to the substrate 1010, and the other surface of the second conductive semiconductor layer 1153 is an upper surface farthest from the substrate 1010.

Further, the semiconductor light emitting device 1050 can include a passivation layer 1157 formed to cover the lateral surfaces of the first conductive semiconductor layer 1155 and the second conductive semiconductor layer 1153. For example, the passivation layer 1157 can be formed to surround the lateral surfaces and the bottom surfaces of the first conductive semiconductor layer 1155 and the second conductive semiconductor layer 1153.

Specifically, the passivation layer 1157 covers the lateral surface of the semiconductor light emitting device to stabilize the characteristics of the semiconductor light emitting device 1050 and is formed of an insulating material. For an example, the passivation layer 1157 may be an insulating thin film made of a silicon compound or oxide. More specifically, the passivation layer 1157 can be formed of one or more materials of AlxOy, SixOy, SixNy, SnxOy, TixOy, CrOx, and ZrOx.

As described above, since the first conductive semiconductor layer 1155 and the second conductive semiconductor layer 1153 are electrically disconnected by the passivation layer 1157, the p-type GaN and the n-type GaN in the semiconductor light emitting device can be insulated from each other.

In this instance, the passivation layer 1157 may include a plurality of passivation layers having different refractive indices so as to reflect light emitted to the lateral surfaces of the first conductive semiconductor layer 1155 and the second conductive semiconductor layer 1153. However, the present disclosure is not limited thereto, and the passivation layer 1157 can be formed as a single layer. The plurality of passivation layers can also be repeatedly layered with a material having a relatively high refractive index and a material having a relatively low refractive index.

Further, the second conductive semiconductor layer 1153 is formed of a porous material capable of being electro-polished, and includes a first layer 1153a disposed on an outer edge of the semiconductor light emitting device 1050, a second layer 1153b disposed below the first layer 1153a and having a lower impurity concentration than the first layer 1153a, and a third layer 1153c disposed between the second layer 1153b and the active layer 1154 and having a higher impurity concentration than the second layer 1153b.

For example, the impurity may be silicon (Si). Specifically, the second conductive semiconductor layer 1153 can be formed to have a higher impurity concentration in the order of the first layer 1153a, the third layer 1153c, and the second layer 1153b. In other words, the first layer 1153a can have an impurity concentration higher than that of the third layer 1153c, and the second layer 1153b of the second conductive semiconductor layer 1153 can have the lowest impurity concentration. In addition, the second layer 1153b may be n-type doped gallium nitride (GaN) and its concentration may be a doped layer at a concentration of $1e^{18}/cm^2$ or less.

In addition, the first layer 1153a can be formed of a porous material capable of being electro-polished. Specifically, the first layer 1153a of a porous material allows light generated within the semiconductor light emitting device 1050 to emit light to a light emitting surface of the semiconductor light emitting device without being trapped in the first layer 1153a.

In addition, light generated within the semiconductor light emitting device 1050 can be diffracted in the first layer 1153a. Therefore, it is possible to minimize the loss of light emitted to a lateral surface of the semiconductor light emitting device 1050. Accordingly, a large amount of light can be emitted to the light emitting surface of the semiconductor light emitting device 1050, thereby enhancing a luminous efficiency of the semiconductor light emitting device 1050.

Besides, a surface 1158 of the first layer 1153a is provided with a first region 1158a and a second region 1158b surrounded by the first region 1158a. The surface 1158 of the first layer 1153a includes the first region 1158a and the second region 1158b having different roughnesses. Specifically, the second region 1158b has a larger surface roughness than the first region 1158a, and a plurality of protrusions 1159 are disposed in the second region 1158b.

In an embodiment, the protrusions 1159 can be formed of a second conductive semiconductor, and formed to have a higher impurity concentration than the first layer 1153a. The protrusions 1159 can also be formed of a material capable of being electro-polished, such as the first layer 1153a.

Moreover, the protrusion 1159 can be a porous structure having pores formed therein. Specifically, the porosity of the protrusion 1159 can be higher than the porosity of the first layer 1153a. Therefore, even when the protrusion 1159 is formed on the first layer 1153a, light emitted from the semiconductor light emitting device 1050 is not disturbed, the loss of the emitted light can be minimized, and a large amount of light may be emitted to the light emitting surface.

Also, an upper surface of the protrusions 1159 can be formed as a flat cut surface. In addition, part of the protrusions 1159 may have a cylindrical shape, and another part of the protrusions 1159 may have a conical shape. In addition, the protrusions 1159 may include different heights. Specifically, the protrusions 1159 may have heights of less than 2 μm, and may preferably include different heights of less than 1 μm.

In addition, the semiconductor light emitting device applied to the display device described above can be fabricated without using laser off. Hereinafter, such a novel fabrication method will be described. In particular, FIGS. 14A through 14E are cross-sectional views illustrating a method of fabricating a display device 1000 according to another embodiment of the present disclosure. According to a fabrication method of the display device 1000 which will be described below, the same or similar reference numerals are designated to the same or similar configurations to the foregoing embodiment, and the description thereof will be substituted by the earlier description.

Figure 14A:
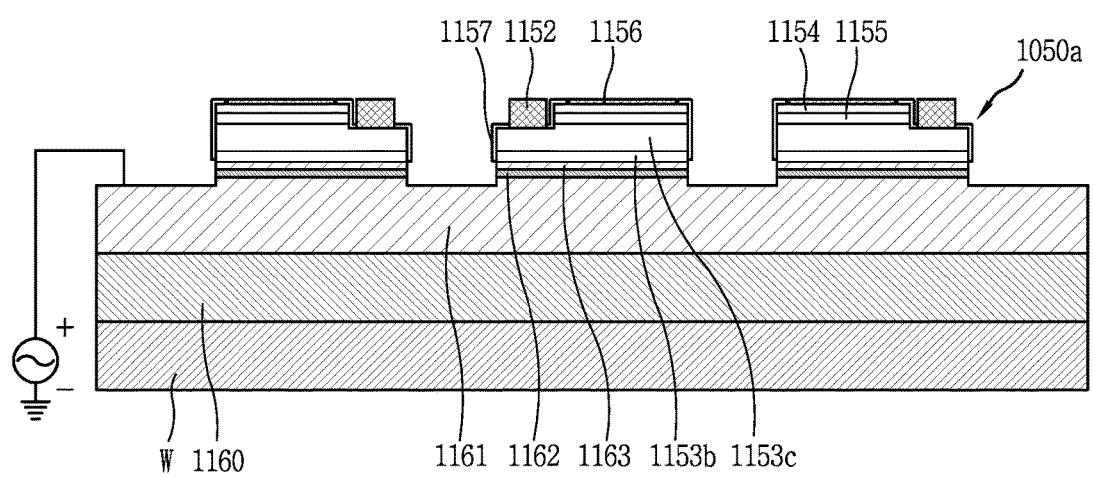
FIGS. 14A through 14E are cross-sectional views illustrating a method of fabricating a display device according to another embodiment of the present disclosure.

Referring to FIG. 14A, a semiconductor light emitting device 1050a can be formed on a growth substrate (W). Specifically, a first conductive semiconductor layer 1155, an active layer 1154, a second conductive semiconductor layer 1153' (FIG. 14B), and an undoped semiconductor layer 1160 are grown on a growth substrate (W) made of a sapphire substrate or a silicon substrate.

Specifically, the undoped semiconductor layer 1160 and the second conductive semiconductor layer 1153' are formed on the growth substrate (W). The second conductive semiconductor layer 1153' is formed and then the active layer 1154 is disposed, and the first conductive semiconductor layer 1155 is formed on the active layer 1154.

In addition, part of the first conductive semiconductor layer 1155, the active layer 1154, and the second conductive semiconductor layer 1153' on the growth substrate (W) is etched to isolate the semiconductor light emitting devices. Furthermore, the first conductive electrode 1156 and the second conductive electrode 1152 corresponding to the first conductive semiconductor layer 1155 and the second conductive semiconductor layer 1153', respectively, are disposed. Moreover, a passivation layer 1157 is formed to cover an outer surface of the first conductive semiconductor layer 1155 and the second conductive semiconductor layer 1153'.

Referring to the drawings, the second conductive semiconductor layer 1153' of the semiconductor light emitting device 1050a formed on the growth substrate (W) can be formed of a plurality of layers. The second conductive semiconductor layer 1153' has a structure layered by a first sacrificial layer 1161, a second sacrificial layer 1162, a first layer 1163, a second layer 1153b, and a third layer 1153c.

Specifically, the second conductive semiconductor layer 1153' is etched by an electrolytic polishing process to sequentially deposit the first sacrificial layer 1161, the second sacrificial layer 1162, and the first layer 1163 which are capable of having pores. The first sacrificial layer 1161, the second sacrificial layer 1162 and the first layer 1163 can include impurities, and the second sacrificial layer 1162 has a higher impurity concentration than the first sacrificial layer 1161 and the first layer 1163. For example, the impurity may be silicon (Si). Furthermore, the second sacrificial layer 1162 can be deposited to have a thickness of less than 2 μm.

Next, a second layer 1153b that is not etched by an electrolytic polishing process and a third layer 1153c disposed between the second layer 1153b and the active layer 1154 are deposited on the first layer 1163. The second layer 1153b has a lower impurity concentration than the first layer 1163, and the first layer 1163 has a higher impurity concentration than the third layer 1153c, and the second layer 1153b has the lowest impurity concentration among the first through third layers.

Further, electro polishing can be performed in which a portion of the second conductive semiconductor layer 1153' is etched by applying a current to the semiconductor light emitting device 1050a formed on the growth substrate (W) in an electrolyte.

Figure 14B:
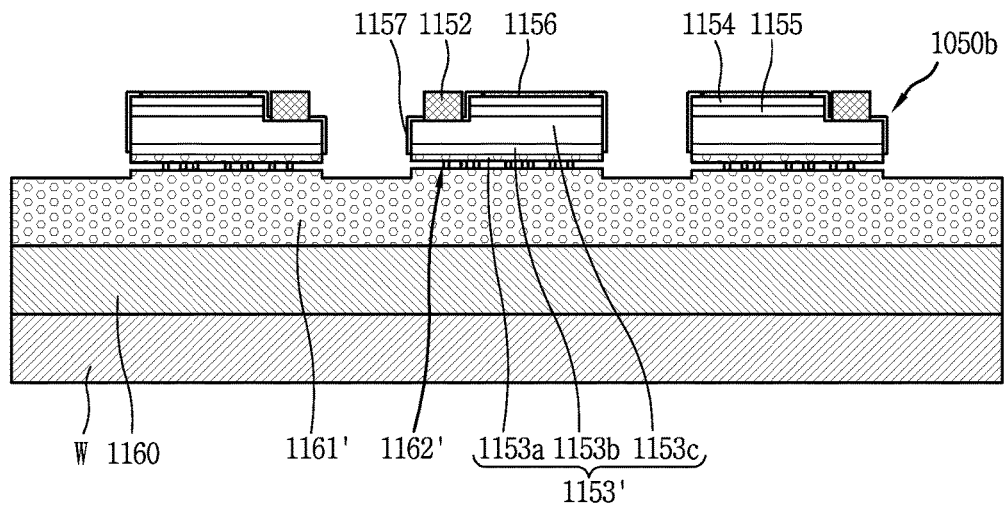

Referring to FIG. 14B, a semiconductor light emitting device 1050b having pores formed by the above-described electrolytic polishing can be formed. The first sacrificial layer 1161, the second sacrificial layer 1162, and the first layer 1163, which have a relatively high concentration of impurities, are etched by an electrolytic polishing to form pores in the semiconductor light emitting device 1050a.

Accordingly, the first sacrificial layer 1161 can be fruited with a first sacrificial layer 1161' having porosity on which pores are formed. Similarly, the first layer 1163 can be formed with a first layer 1153a having porosity on which pores are formed. Further, the second sacrificial layer 1162 having the highest impurity concentration can be etched at a high rate according to electro-polishing. As a result, the second sacrificial layer 1162 can have a porous structure with a higher porosity than the first sacrificial layer 1161 and the first layer 1153a.

Specifically, the second sacrificial layer 1162 can be formed with a plurality of pillars 1162', which are porous structures having pores formed therein by etching according to electro-polishing. In other words, a porosity of the pillars 1162' can be formed to be higher than that of the first sacrificial layer 1161 and the first layer 1153a due to a difference in reaction rate according to electro-polishing. Furthermore, the plurality of pillars 1162' connect the first layer 1153a and the first sacrificial layer 1161' in the form of a cylindrically or a conically shaped pillar.

In addition, as the electro-polishing proceeds from an edge of the semiconductor light emitting device 1050a to the inside, a surface 1158 of the first layer 1153a is rapidly etched to form a first region 1158a having a relatively low roughness and a second region 1158b surrounded by the first region 1158a.

Figure 14C:
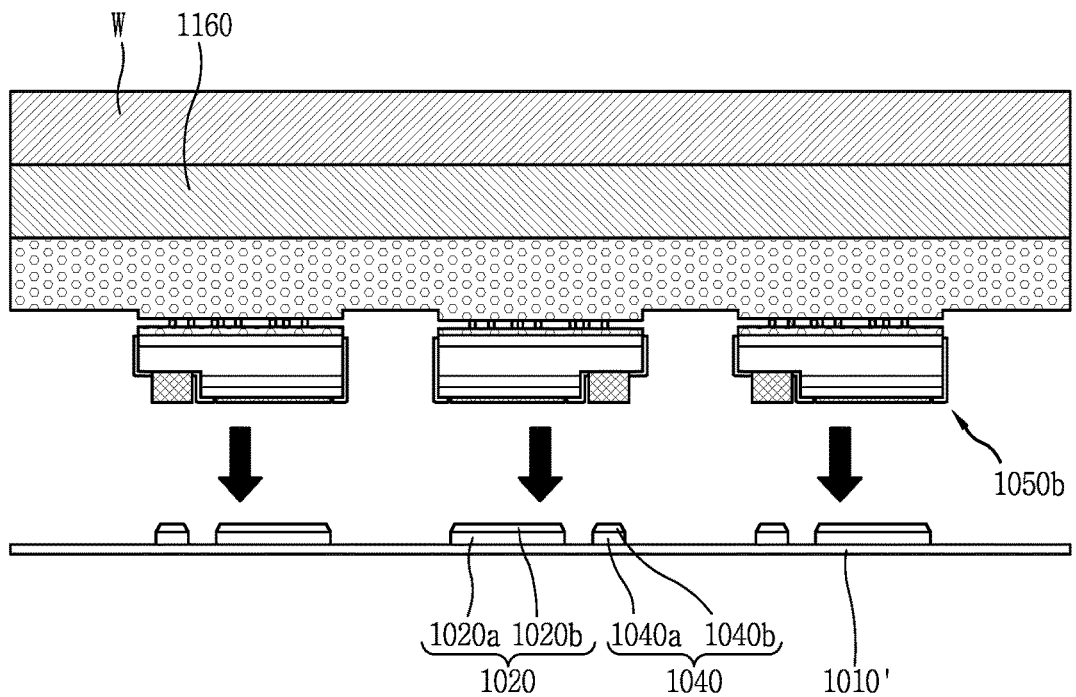

Referring to FIG. 14C, the semiconductor light emitting device 1050b formed with pores is disposed to be electrically connected to the wiring substrate 1010'. The first conductive electrode 1156 and the second conductive electrode 1152 of the semiconductor light emitting device 1050b formed with pores are disposed on the first electrode 1020 and the second electrode 1040 of the wiring substrate 1010' in a corresponding manner.

Figure 14D:
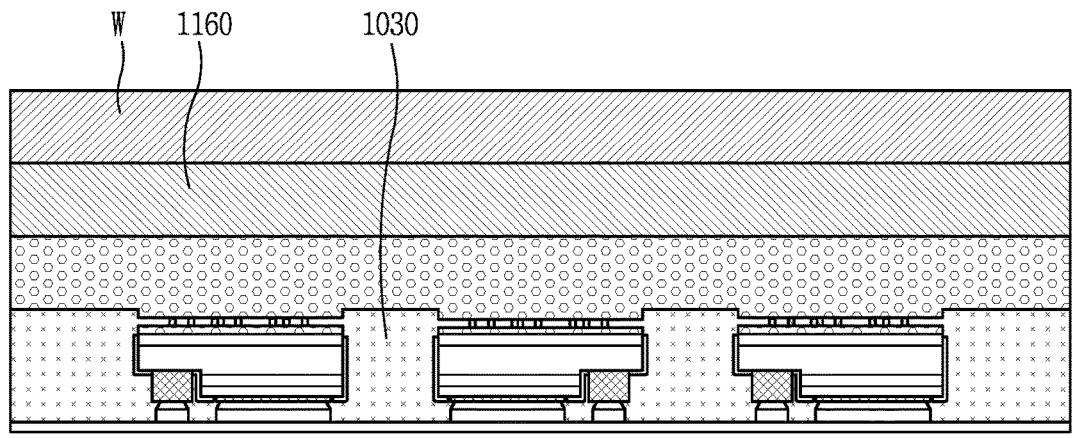

Referring to FIG. 14D, the semiconductor light emitting device 1050b formed with pores are disposed to be electrically connected to the wiring substrate 1010'. The first electrode 1020 of the wiring substrate 1010' includes a protruded metal layer 1020a and an adhesive layer 1020b. In addition, the first conductive electrode 1156 and the metal layer 1020a are electrically coupled to each other by applying pressure or heat to the adhesive layer 1020b.

Similarly to coupling between the first electrode 1020 and the first conductive electrode 1056, coupling between the second electrode 1040 and the second conductive electrode 1052 can be formed. The second electrode 1040 includes a protruded metal layer 1040a and an adhesive layer 1020b. Further, the first conductive electrode 1152 and the metal layer 1040a are electrically coupled to each other by applying pressure or heat to the adhesive layer 1040b.

Figure 14E:
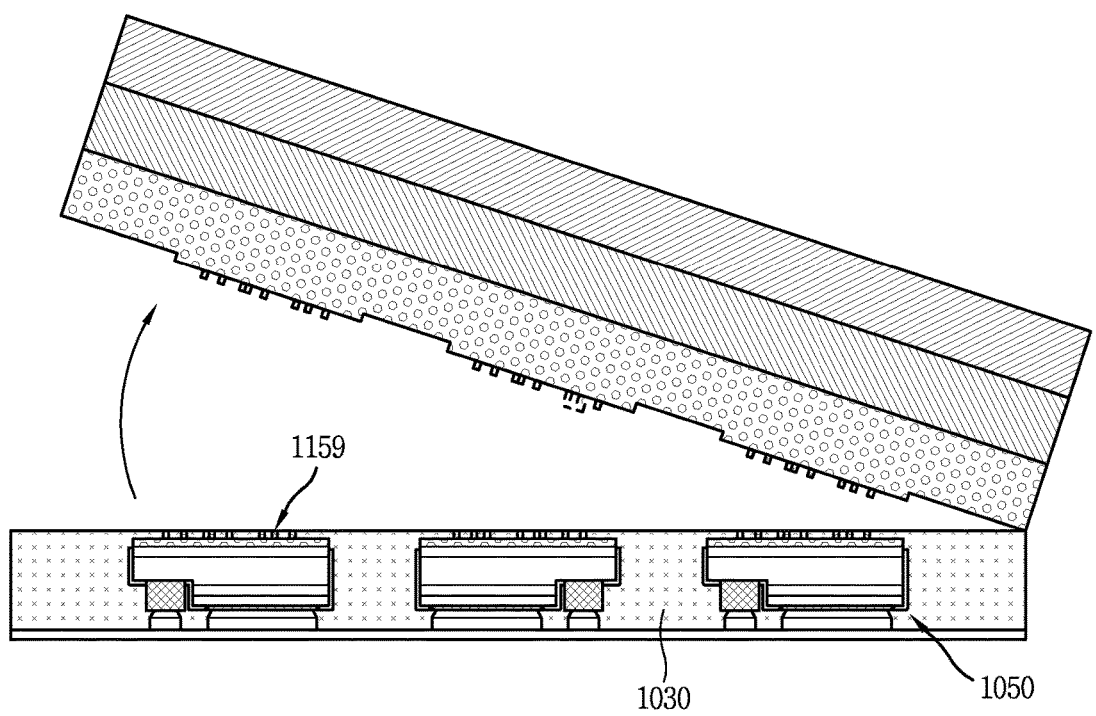

Referring to FIG. 14E, the growth substrate (W) is separated from the wiring substrate 1010' to fabricate the display device 1000. The semiconductor light emitting device 1050b is separated from the growth substrate (W) to electrically connect only the semiconductor light emitting device 1050 to the wiring substrate 1010'. In order to separate the growth substrate (W), a mechanical lift-off method can be performed. In other words, physical energy can be applied to form the semiconductor light emitting device 1050 separated from the growth substrate (W).

Specifically, the pillar 1162' generated by a difference in reaction rate according to the foregoing electro-polishing on the second sacrificial layer 1162 can be cut by physical energy to separate the semiconductor light emitting device 1050 from the growth substrate (W). The pillar 1162' having pores can be cut by physical energy to form protrusions 1159 having different heights. An upper surface of the protrusions 1159 can be formed as a flat cut surface. In addition, part of the protrusions 1159 may have a cut cylindrical shape. Moreover, another part of the protrusions 1159 may have a cut conical shape.

Besides, the protrusions 1159 may include different heights. Specifically, the protrusions 1159 can have a height of less than 2 μm, and preferably include different heights of less than 1 μm. Furthermore, a surface 1158 of the first layer 1153a includes a first region 1158a and a second region 1158b having different roughnesses as electro-polishing proceeds from an edge of the semiconductor light emitting device 1050a to an inside thereof.

As described above, the surface 1158 of the first layer 1153a includes a first region 1158a and a second region 1158b surrounded by the first region 1158a and disposed with a plurality of protrusions 1159. Specifically, the second region 1158b has a larger surface roughness than the first region 1158a, and a plurality of protrusions 1159 are disposed in the second region 1158b.

As illustrated in FIGS. 14A through 14E described above, the display device 1000 of the present disclosure can be fabricated by a mechanical lift-off method, thereby minimizing damage to the semiconductor light emitting device due to heat by laser or chemicals generated when the semiconductor light emitting device is separated by a laser lift-off method or a chemical lift-off method. In addition, since the semiconductor light emitting device can be separated by physical energy without an additional facility, the process cost is reduced. As a result, the fabrication cost is reduced.

In addition, when the display device is fabricated by separating the semiconductor light emitting device by physical energy, a thickness of the semiconductor light emitting device can be formed to be less than 10 μm, which is a thickness reduced by 50% or more as compared to a semiconductor light emitting device fabricated by a laser lift-off method or a chemical lift-off method. In other words, the semiconductor light emitting device of the display device fabricated by a mechanical lift off method has an advantage of reducing the thickness. As the thickness of the semiconductor light emitting device is reduced, loss of light emitted and emitted from an inside of the semiconductor light emitting device can be decreased, thereby increasing the light efficiency.

In addition, a display device fabricated by the foregoing fabrication method can be modified into various forms. Hereinafter, these modified examples will be described. Furthermore, according to another embodiment which will be described below, the same or similar reference numerals are designated to the same or similar configurations to the foregoing example, and the description thereof will be substituted by the earlier description.

Figure 15:
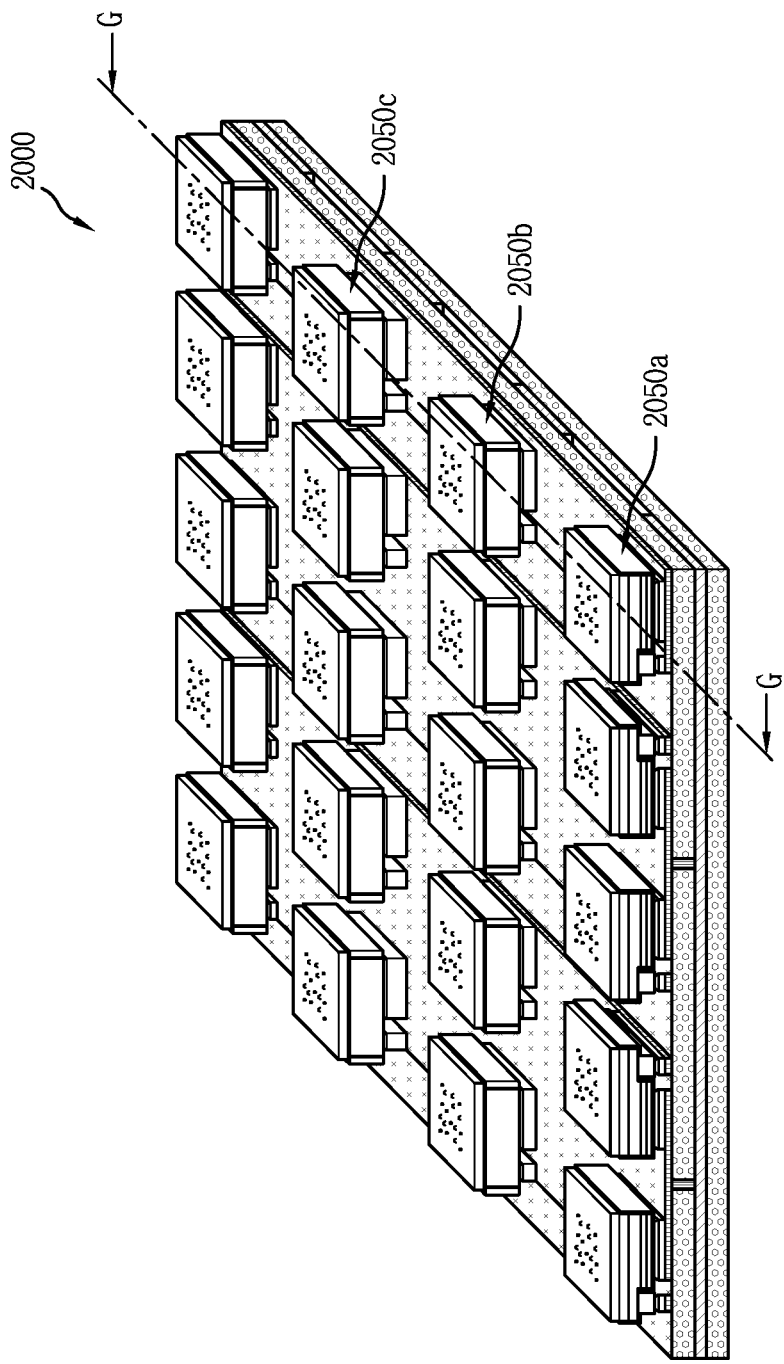
FIG. 15 is an enlarged view of portion "A" in FIG. 1 illustrating another embodiment of the present disclosure of a display device having a new structure.

FIG. 15 is an enlarged view of portion "A" in FIG. 1 illustrating still another embodiment of the present disclosure of a display device 2000 having a novel structure. Furthermore, FIG. 16 is a cross-sectional view taken along line G-G in FIG. 15.

Figure 16:
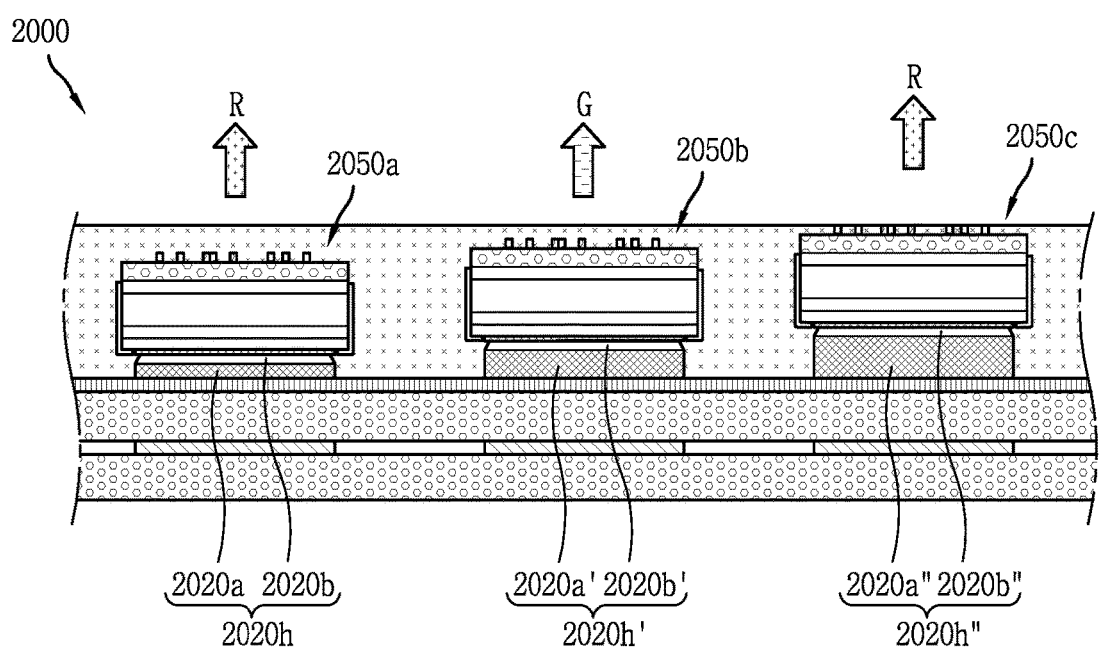
FIG. 16 is a cross-sectional view taken along line G-G in FIG. 15.

Referring FIGS. 15 and 16, flip-chip semiconductor light emitting devices 2050a, 2050b, 2050c capable of emitting blue, green and red light without having phosphor layers can be disposed on the first electrode and the second electrode of the wiring substrate. The first electrodes 2020h, 2020h', 2020h" having different heights from the substrate 2010 and the second electrodes 2040h, 2040h', 2040h" having different heights from the substrate 2010 are disposed on the wiring substrate 2010'.

The first electrodes 2020h, 2020h', 2020h" and the second electrodes 2040h, 2040h', 2040h" having different heights from the substrate 2010 may have a plurality of metal layers and a plurality of adhesive layers. As a result, the first electrodes 2020h, 2020h', 2020h" and the second electrodes can be formed at different heights. FIG. 16 also illustrates the first electrodes 2020h, 2020h', 2020h", respectively, including a protruded metal layer 2020a, 2020a' and 2020a" and an adhesive layer 2020a, 2020a' and 2020a".

Referring to FIG. 16, a red semiconductor light emitting device 2050a is disposed on the first electrode 2020h and the second electrode to emit red light. In addition, a green semiconductor light emitting device 2050b is disposed on the first electrode 2020h' and the second electrode to emit green light. Moreover, a red semiconductor light emitting device 2050c is disposed on the first electrode 2020W' and the second electrode to emit red light. As a result, red, green, and blue sub-pixels constitute one pixel by the red, green, and blue semiconductor light emitting devices, thereby implementing a full color display.

Further, in another embodiment using a semiconductor light emitting device having a vertical structure other than a flip chip type, a vertical semiconductor light emitting device capable of emitting blue, green, and red light may be arranged and electrically connected to first electrodes having different heights similarly to FIG. 15. Meanwhile, contrary to the flip-chip semiconductor light emitting device described above, according to a vertical semiconductor light emitting device, the first conductive electrode and the second conductive electrode are arranged in a top-down direction, and thus a second electrode separated from the wiring substrate and electrically connected to the second conductive electrode is provided therein.

Figure 17:
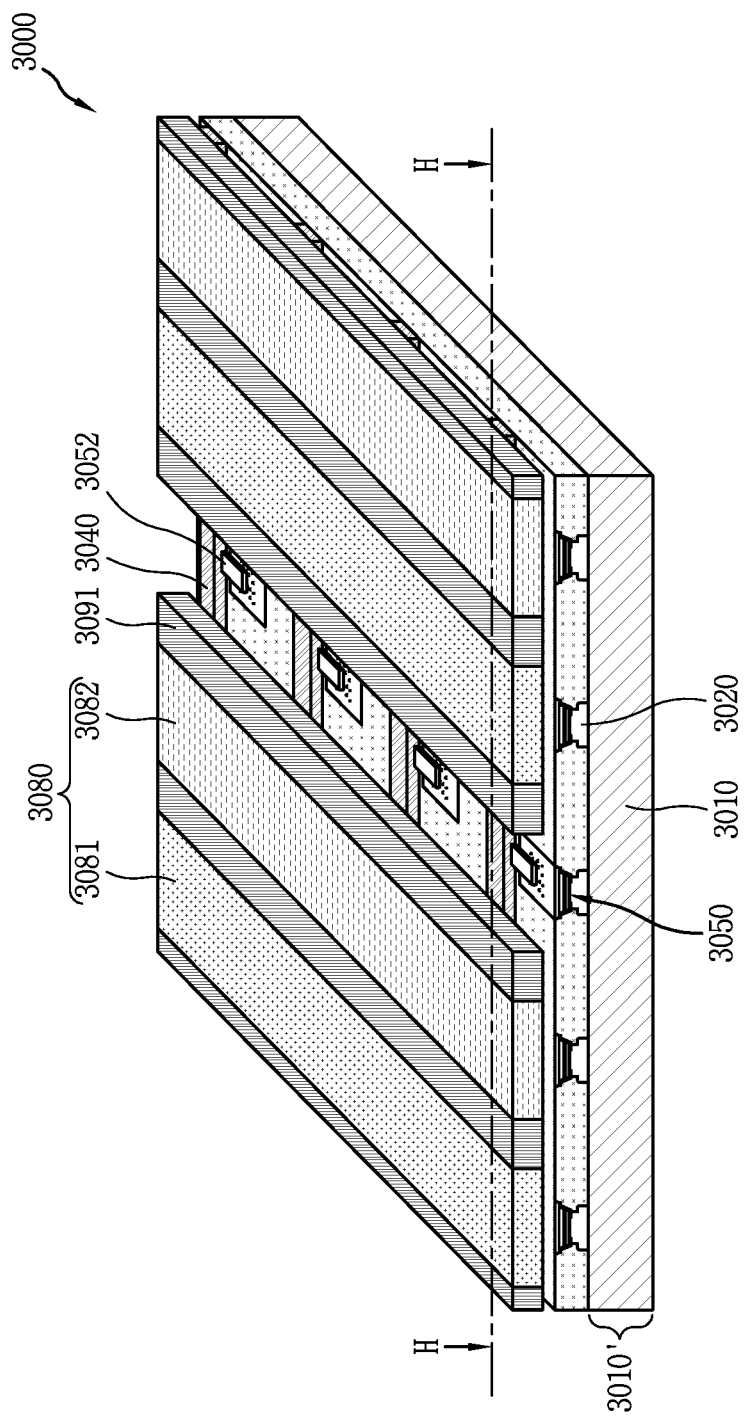
FIG. 17 is an enlarged view of portion "A" in FIG. 1 illustrating still another embodiment of the present disclosure of a display device having a new structure.
Figure 18:
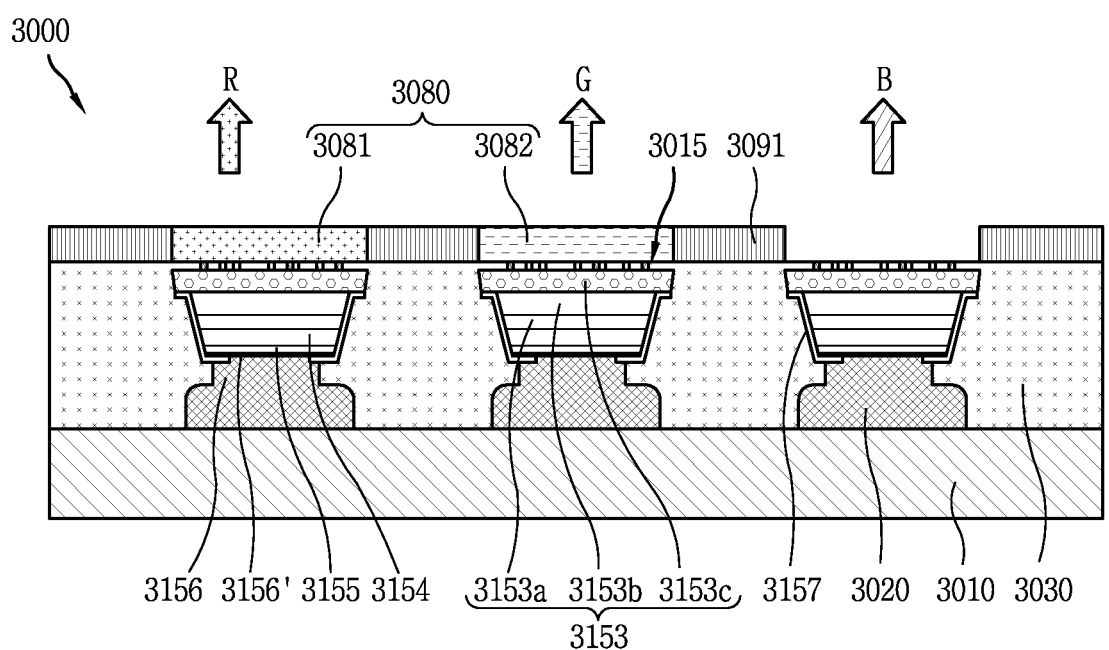
FIG. 18 is a cross-sectional view taken along line H-H in FIG. 17.

FIG. 17 is an enlarged view of portion "A" in FIG. 1 illustrating still another embodiment of the present disclosure of a display device 3000 having a novel structure. Furthermore, FIG. 18 is a cross-sectional view taken along line H-H in FIG. 17. According to still another embodiment which will be described below, the same or similar reference numerals are designated to the same or similar configurations to the foregoing example, and the description thereof will be substituted by the earlier description.

Referring to FIGS. 17 and 18, the display device 3000 with a novel structure may include a vertical semiconductor light emitting device. Specifically, the semiconductor light emitting device 3050 of the display device 3000 includes a first conductive electrode 3156 and a second conductive electrode 3152, a first conductive semiconductor layer 3155 disposed with the first conductive electrode 3156, a second conductive semiconductor layer 3153 configured to overlap with the first conductive semiconductor layer 3155, and disposed with the second conductive electrode 3152, and an active layer 3154 disposed between the first conductive semiconductor layer 3155 and the second conductive semiconductor layer 3153. The semiconductor light emitting device 3050 may be a vertical semiconductor light emitting device in which the first conductive electrode 3156 and the second conductive electrode 3152 are arranged in a top-down direction. In addition, a transparent electrode layer 3156' can be formed between the first conductive semiconductor layer 3155 and the first conductive electrode 3156, and the transparent electrode layer 3156' may be indium tin oxide (ITO) in an embodiment.

Moreover, the semiconductor light emitting device 3050 may be in ohmic contact with the second electrode 3052 by the first layer 3153a disposed on an outer edge of the second conductive semiconductor layer 3153 without any additional surface treatment such as texturing. In more detail, the first layer 3153a is porous with a porous material capable of electrolytic polishing. Specifically, it is advantageous to form an ohmic contact with the second electrode 3052 due to a high impurity concentration.

FIGS. 19A through 19E are cross-sectional views illustrating a method of fabricating a display device 3000 according to yet still another embodiment of the present disclosure. According to a fabrication method of the display device 3000 which will be described below, the same or similar reference numerals are designated to the same or similar configurations to the foregoing embodiment, and the description thereof will be substituted by the earlier description.

Figure 19A:
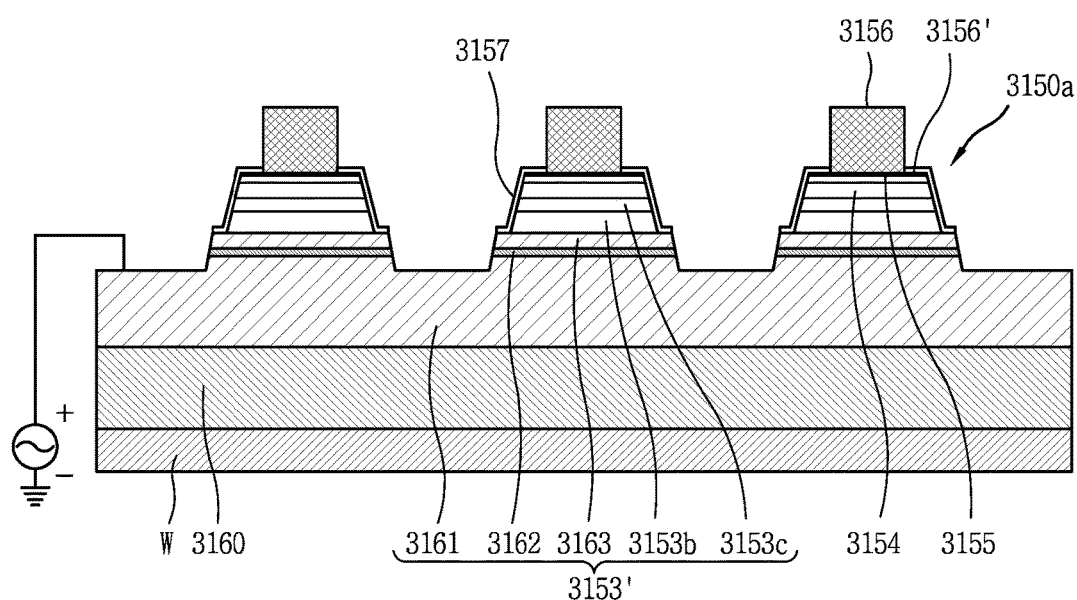
FIGS. 19A through 19E are cross-sectional views illustrating a method of fabricating a display device according to yet still another embodiment of the present disclosure.

Referring to FIG. 19A, the present disclosure may include a process of growing a first conductive semiconductor layer 3155, an active layer 3154, a second conductive semiconductor layer 3153', a second conductive semiconductor layer 3153', and an undoped semiconductor layer 3160 on a growth substrate (W) in order to fabricate the display device 3000.

Specifically, the undoped semiconductor layer 3160 and the second conductive semiconductor layer 3153' are formed on the growth substrate (W). The second conductive semiconductor layer 3153' is formed and then the active layer 3154 is disposed, and the first conductive semiconductor layer 3155 is formed on the active layer 3154.

The second conductive semiconductor layer 3153' formed on the growth substrate (W) can be formed of a plurality of layers. The second conductive semiconductor layer 3153' may have a structure layered by a first sacrificial layer 3161, a second sacrificial layer 3162, a first layer 3163, a second layer 3153b, and a third layer 3153c.

In addition, part of the first conductive semiconductor layer 3155, the active layer 3154, and the second conductive semiconductor layer 3153' on the growth substrate (W) can be etched to isolate the semiconductor light emitting devices. In addition, the present disclosure may include a process of forming a first conductive electrode 3156 corresponding to the first conductive semiconductor layer 1155.

Figure 19B:
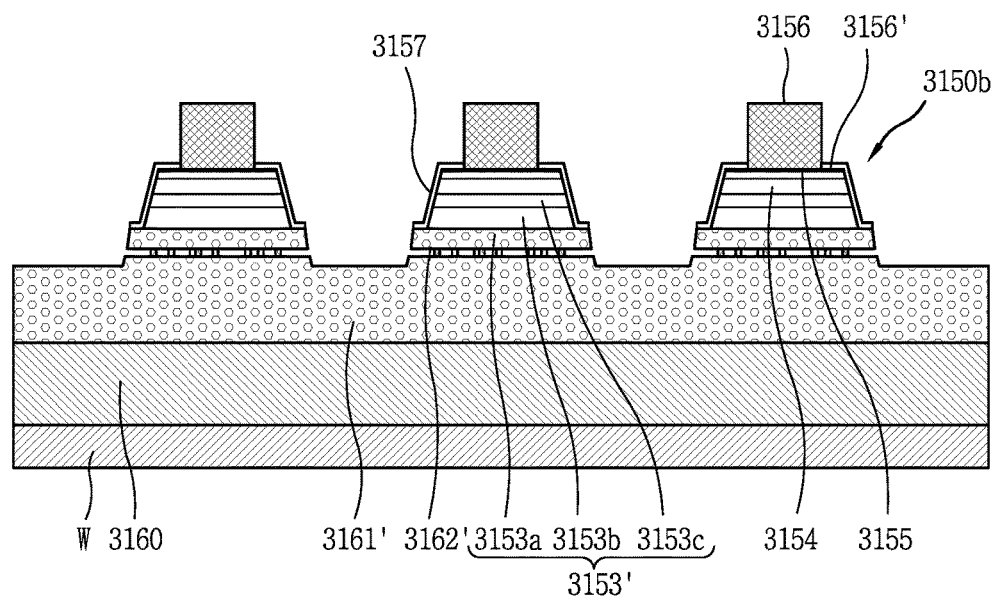

Referring to FIG. 19B, a first sacrificial layer 3161, a second sacrificial layer 3162, and a first layer 3163 are etched by an electro-polishing process on the second conductive semiconductor layer 3153' to have pores. As a result, the second sacrificial layer 3162 having the highest impurity concentration can be etched at a high rate according to electro-polishing. In other words, the second sacrificial layer 3162 may have a porous structure with a higher porosity than the first sacrificial layer 3161 and the first layer 3153a.

Specifically, the second sacrificial layer 3162 can be formed with a plurality of pillars 3162', which are porous structures having pores formed therein by etching according to electro-polishing. In other words, a porosity of the pillars 3162' can be formed to be higher than that of the first sacrificial layer 3161 and the first layer 3153a due to a difference in reaction rate according to electro-polishing. Furthermore, the plurality of pillars 3162' may connect the first layer 3153a and the first sacrificial layer 3161' in the form of a cylindrically or a conically shaped pillar.

Figure 19C:
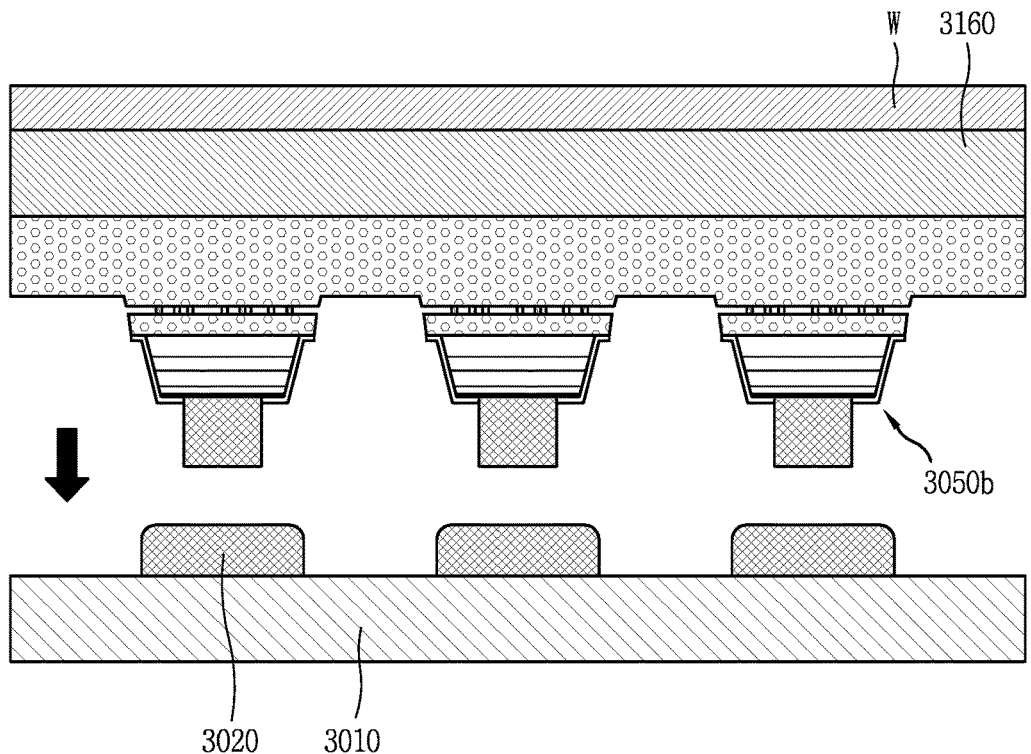
Figure 19D:
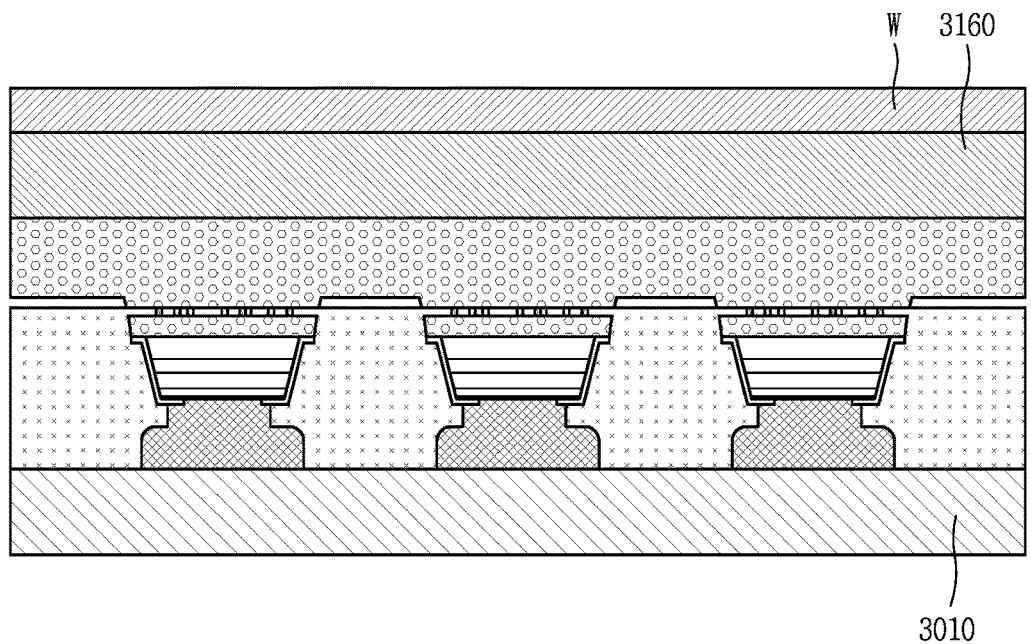

Referring to FIG. 19C, the semiconductor light emitting device 3050b formed with pores can be disposed to be electrically connected to the wiring substrate 3010'. Referring to FIG. 19D, the semiconductor light emitting device 3050b formed with pores can be electrically connected to the wiring substrate 3010'.

The first electrode 3020 of the wiring substrate 3010' may include a protruded metal layer 3020a and an adhesive layer 3020b. The first conductive electrode 3156 and the metal layer 3020a are electrically coupled to each other by applying pressure or heat to the adhesive layer 3020b.

Figure 19E:
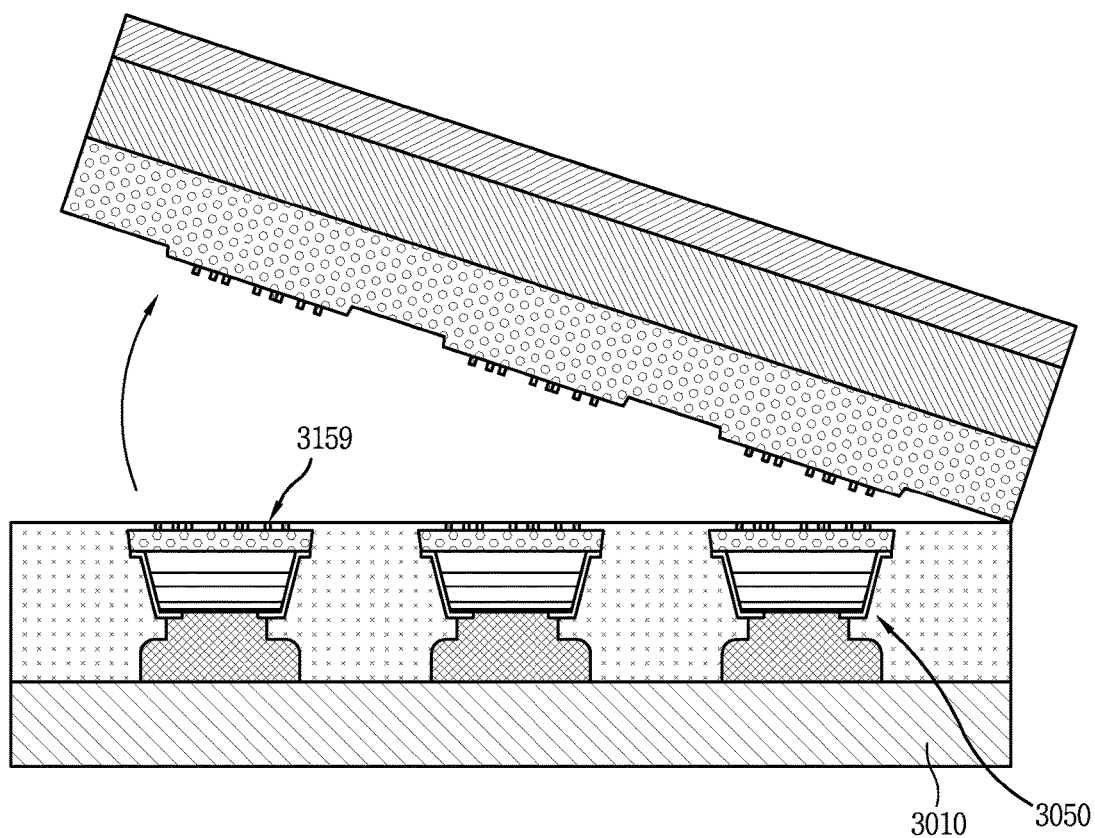

Referring to FIG. 19E, the growth substrate (W) may be separated from the wiring substrate 3010' to fabricate the display device 3000. The semiconductor light emitting device 3050b may be separated from the growth substrate (W) to electrically connect only the semiconductor light emitting device 3050 to the wiring substrate 3010'. In order to separate the growth substrate (W), a mechanical lift-off method may be performed.

The configurations and methods according to the above-described embodiments will not be applicable in a limited way to a display device using the foregoing semiconductor light emitting device, and all or part of each embodiment may be selectively combined and configured to make various modifications thereto.

What is claimed is:

1. A display device, comprising:
   a substrate; and
   a plurality of semiconductor light emitting devices on the substrate,
   wherein at least one of the semiconductor light emitting devices comprises:
   a first conductive electrode and a second conductive electrode;
   a first conductive semiconductor layer on which the first conductive electrode is disposed;
   a second conductive semiconductor layer overlapping the first conductive semiconductor layer, and on which the second conductive electrode is disposed; and
   an active layer disposed between the first conductive semiconductor layer and the second conductive semiconductor layer, and
   wherein the second conductive semiconductor layer comprises:
   a first layer including a porous material capable of being electro-polished and disposed on an outer surface of the semiconductor light emitting device;
   a second layer disposed under the first layer and having a lower impurity concentration than the first layer; and
   a third layer disposed between the second layer and the active layer and having a higher impurity concentration than the second layer.

2. The display device of claim 1, wherein the first layer comprises:
   a first region; and
   a second region surrounded by the first region, and
   wherein the second region includes a plurality of protrusions and has a larger surface roughness than the first region.

3. The display device of claim 2, wherein the protrusions include a second conductive semiconductor, and have a higher impurity concentration than the first layer.

4. The display device of claim 2, wherein part of the protrusions have a cylindrical shape, and an upper surface of the protrusions is a flat cut surface.

5. The display device of claim 4, wherein another part of the protrusions have a conical shape, and the upper surface of the protrusions is the flat cut surface.

6. The display device of claim 2, wherein part of the protrusions have different heights from the first layer.

7. The display device of claim 1, wherein the first layer has a higher impurity concentration than the third layer.

8. The display device of claim 1, wherein the substrate comprises a wiring substrate having a first electrode corresponding to the first conductive electrode.

9. The display device of claim 8, wherein the first electrode comprises:
   a metal layer; and
   an adhesive layer formed between the first conductive electrode and the metal layer to electrically couple the first conductive electrode to the metal layer by pressure or heat.

10. The display device of claim 8, wherein semiconductor light emitting devices for emitting red, green and blue light are respectively disposed on the first electrode, and wherein the semiconductor light emitting devices for emitting red, green, and blue light are electrically coupled to first electrodes having different heights.

11. The display device of claim 8, wherein the wiring substrate further comprises a second electrode corresponding to the second conductive electrode, and wherein the second electrode comprises:

a metal layer; and an adhesive layer formed between the second conductive electrode and the metal layer to electrically couple the second conductive electrode to the metal layer by pressure or heat.

12. The display device of claim 8, further comprising:

a second electrode spaced apart from the wiring substrate and electrically connected to the second conductive electrode.

13. A semiconductor light emitting device, comprising:

a first conductive electrode and a second conductive electrode;

a first conductive semiconductor layer on which the first conductive electrode is disposed;

a second conductive semiconductor layer overlapping the first conductive semiconductor layer, on which the second conductive electrode is disposed; and an active layer disposed between the first conductive semiconductor layer and the second conductive semiconductor layer, and wherein the second conductive semiconductor layer comprises:

a first layer including a porous material capable of being electro-polished and disposed on an outer surface of the semiconductor light emitting device;

a second layer disposed under the first layer and having a lower impurity concentration than the first layer; and a third layer disposed between the second layer and the active layer and having a higher impurity concentration than the second layer.

14. The semiconductor light emitting device of claim 13, wherein the first layer comprises:

a first region; and a second region surrounded by the first region, and wherein the second region includes a plurality of protrusions and has a larger surface roughness than the first region.

15. The semiconductor light emitting device of claim 14, wherein the protrusions include a second conductive semiconductor, and have a higher impurity concentration than the first layer.

16. The semiconductor light emitting device of claim 14, wherein part of the protrusions have a cylindrical shape, and wherein an upper surface of the protrusions is a flat cut surface.

* * * * *